United States Patent
Shimizu et al.

(10) Patent No.: US 7,116,598 B2
(45) Date of Patent: Oct. 3, 2006

(54) SEMICONDUCTOR MEMORY

(75) Inventors: Yuui Shimizu, Yokohama (JP);
Yoshihisa Iwata, Yokohama (JP); Kenji Tsuchida, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 10 days.

(21) Appl. No.: 11/084,037

(22) Filed: Mar. 21, 2005

(65) Prior Publication Data
US 2006/0067149 A1 Mar. 30, 2006

(30) Foreign Application Priority Data
Sep. 28, 2004 (JP) ............................. 2004-282030

(51) Int. Cl.
*G11C 7/02* (2006.01)
(52) U.S. Cl. .................. 365/210; 365/189.09; 365/190
(58) Field of Classification Search ................ 365/210, 365/202, 207, 189.07, 189.06, 189.09, 190, 365/158, 201
See application file for complete search history.

(56) References Cited

U.S. PATENT DOCUMENTS 6,151,246 A * 11/2000 So et al. ................. 365/185.09
6,545,906 B1 4/2003 Savtchenko et al.
2006/0092734 A1* 5/2006 Tsuchida et al. ............ 365/205

* cited by examiner

*Primary Examiner*—Richard Elms
*Assistant Examiner*—Hien N Nguyen
(74) *Attorney, Agent, or Firm*—Oblon, Spivak, McClelland, Maier & Neustadt, P.C.

(57) ABSTRACT

A semiconductor memory comprises a memory cell, a pair of reference cells for use in generation of a reference electric potential, a first read circuit which compares a read electric potential obtained from the memory cell with the reference electric potential and determines data in the memory cell, a second read circuit which detects a state of the pair of reference cells and outputs a detection signal indicating the state of the pair of reference cells, and a control circuit which controls a write operation for the pair of reference cells based on the detection signal.

20 Claims, 12 Drawing Sheets

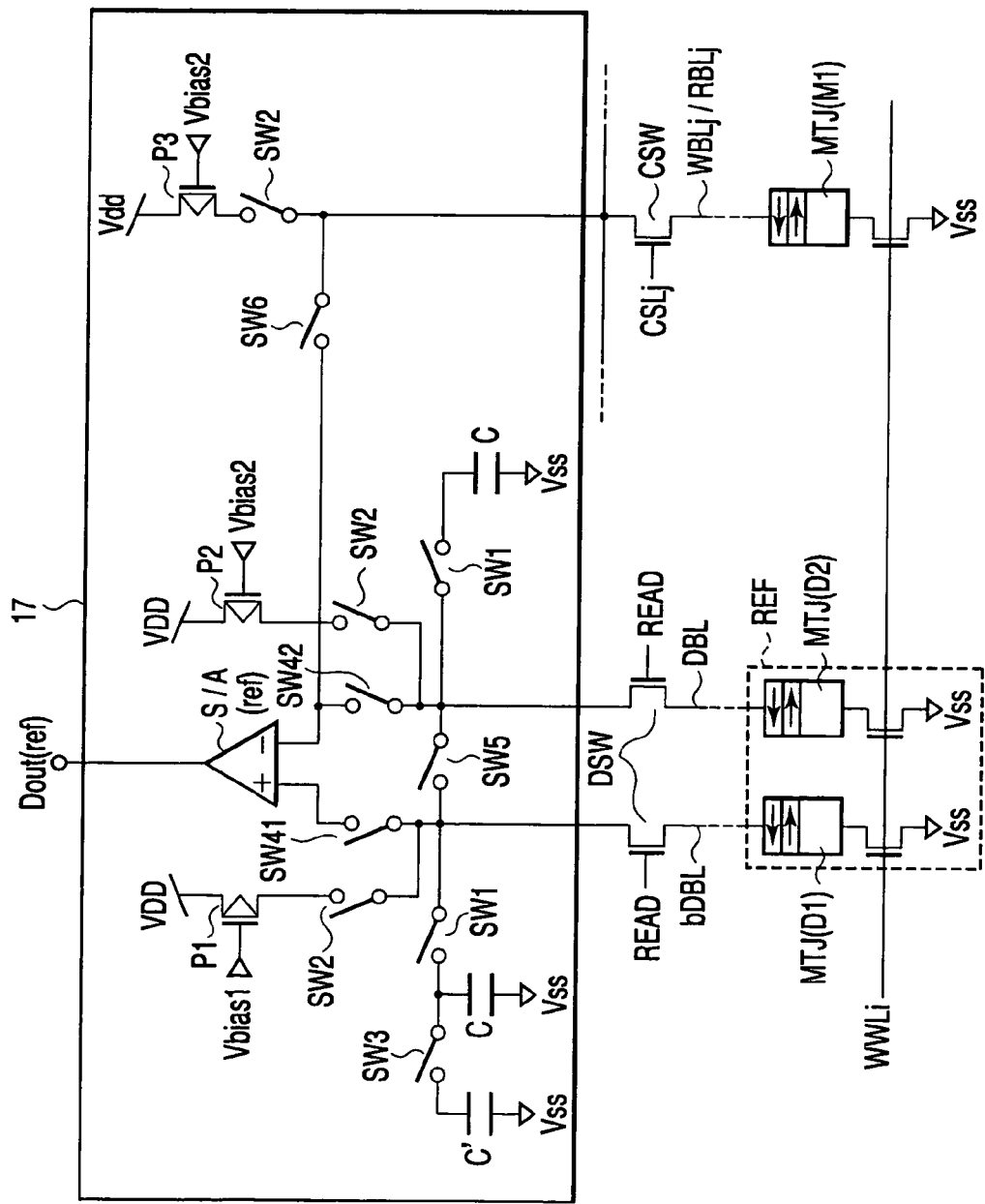

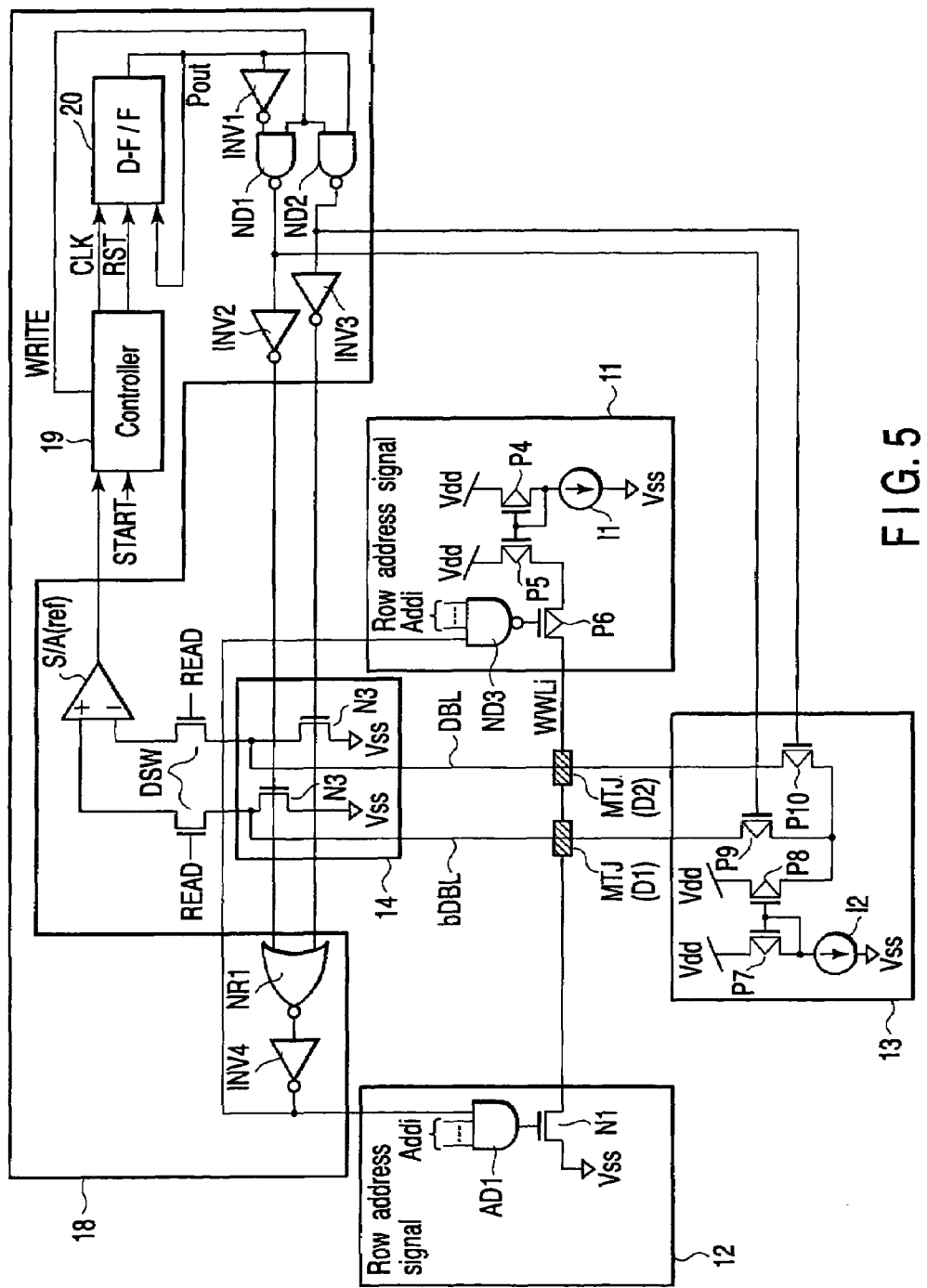
F I G. 5

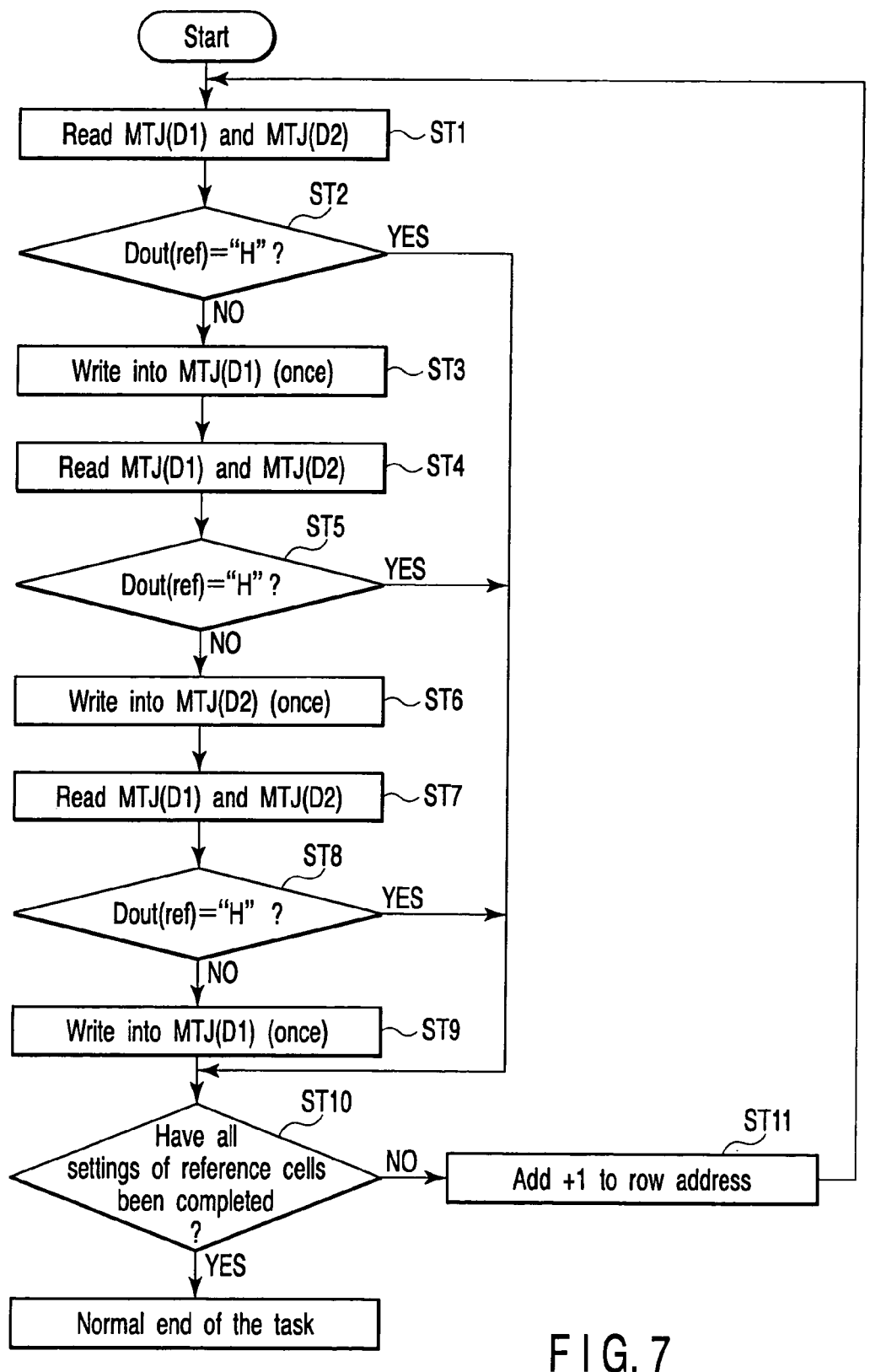
F I G. 7

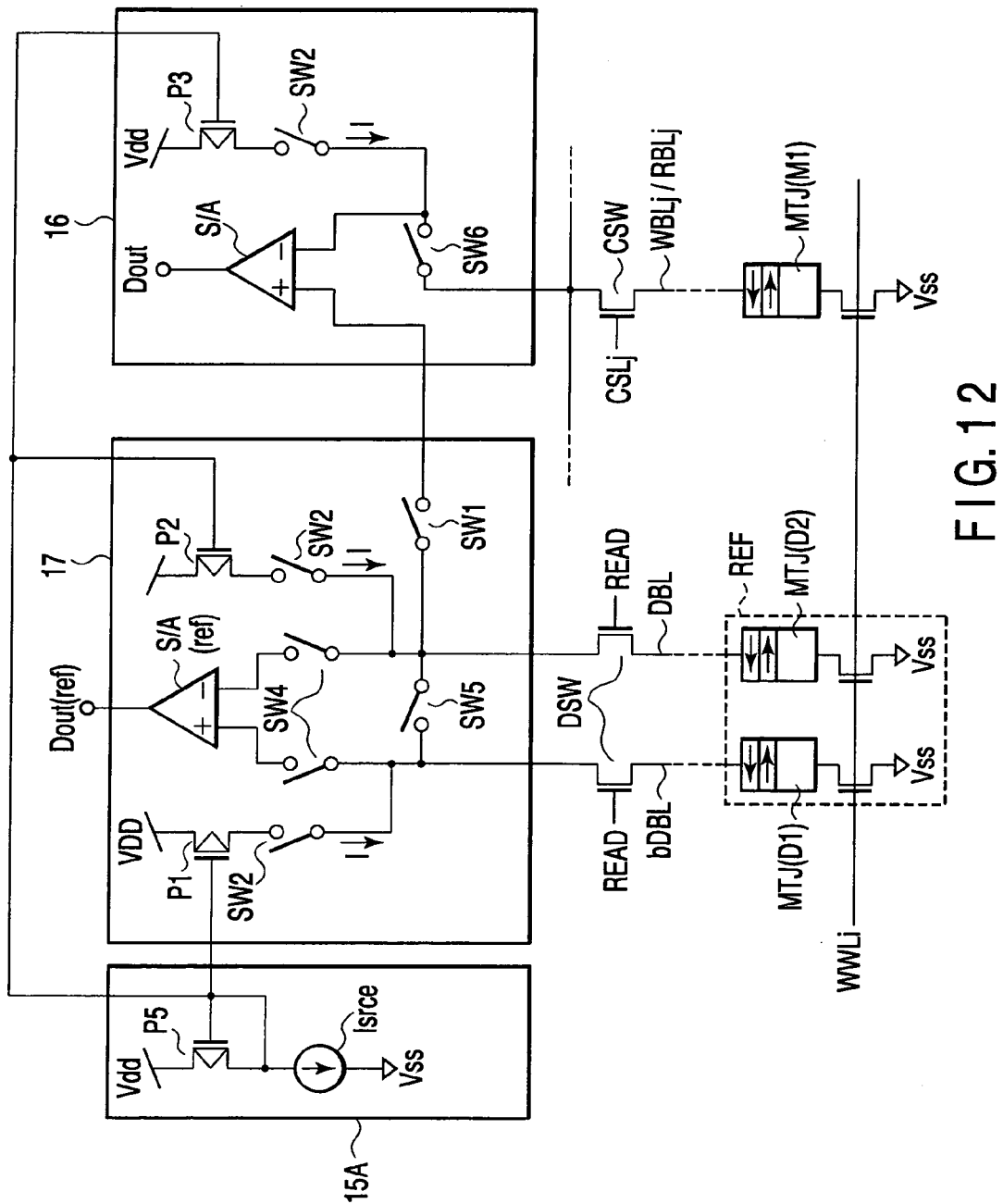
F I G. 12

ENABLE: enable signal

ENABLE: enable signal

SEMICONDUCTOR MEMORY

CROSS-REFERENCE TO RELATED APPLICATIONS

This application is based upon and claims the benefit of priority from prior Japanese Patent Application No. 2004-282030, filed Sep. 28, 2004, the entire contents of which are incorporated herein by reference.

BACKGROUND OF THE INVENTION

1. Field of the Invention

The present invention relates to a semiconductor memory, and more particularly, to a semiconductor memory for use as a magnetic random access memory utilizing the tunneling magnetoresistive (TMR) effect which uses a toggle write system.

2. Description of the Related Art

In order to practically use a magnetic random access memory, it is necessary to restrict a TMR effect between MTJ (magnetic tunnel junction) elements and to eliminate disturbance during a write operation.

As one technique for achieving this, a toggle write system has been noticed (refer to U.S. Pat. No. 6,545,906, for example). In this write system, there is used an MTJ element, wherein a free layer is composed of two ferromagnetic layers which are weakly exchange-coupled with each other. In addition, an axial direction for facilitating magnetization of the MTJ elements is set in a direction which is different from a direction in which two write lines orthogonal to each other extend.

A write operation is always carried out by feeding a write current in a predetermined direction to the two write lines whatever a data value may be.

In the toggle write system, a data value changes every time one write operation is carried out for an MTJ element targeted for a write operation.

Therefore, in this system, before carrying out a write operation, it is necessary to read data on an MTJ element targeted for a write operation and grasp a state of that MTJ element.

Namely, in the case where write data is identical to data in the MTJ element targeted for a write operation, there is no need for carrying out a write operation. Only when the present data differ from the write data, only one write operation is carried out.

In a read operation, in general, a read electric potential obtained by an MTJ element targeted for a read operation is compared with a reference electric potential, and a data value is determined.

This reference electric potential is generated from a reference cell (MTJ element) for storing data "1" and a reference cell (MTJ element) for storing data "0".

For example, these two reference cells are connected in parallel, and an intermediate electric potential between a read electric potential obtained by the cell for storing data "1" and a read electric potential obtained by the cell for storing data "0" are defined as a reference electric potential.

However, in a magnetic random access memory using a toggle write system, in the case of generating the reference cell for storing data "1" and the reference cell for storing data "0", it is necessary to discuss a method for setting a data value in response to each of these reference cells.

This is because the state of the MTJ element of the magnetic random access memory using the toggle write system depends on the state of the MTJ element before a write operation, and the state of the MTJ element cannot be determined only by a write operation, whereas, for example, in die sort testing before shipment, the states of the reference cells are different depending on cells.

Moreover, it is impossible to control the magnetization direction of the MTJ element in the way of fabrication because of an exchange coupling.

Therefore, in setting the data value in response to the reference cell, for example, all the reference cells connected to one of a pair of reference cell bit lines must be reliably set to "1", and all the reference cells connected to the other must be reliably set to "0".

However, if a large amount of time and troubles is required to provide these settings, it causes high manufacturing cost and is inconvenient.

Hence, with respect to a semiconductor memory in which the state of the memory cell (for example, MTJ element) cannot be determined by carrying out a write operation as long as a read operation is not carried out in advance, if there exists a sequence for automatically providing setting of a data value in response to a reference cell, the existence of the sequence is very effective in reduction of the manufacturing cost.

BRIEF SUMMARY OF THE INVENTION

A semiconductor memory according to an aspect of the present invention comprises: a memory cell; a pair of reference cells for use in generation of a reference electric potential; a first read circuit which compares a read electric potential obtained from the memory cell with the reference electric potential and determines data in the memory cell; a second read circuit which detects a state of the pair of reference cells and outputs a detection signal indicating the state of the pair of reference cells; and a control circuit which controls a write operation for the pair of reference cells based on the detection signal.

BRIEF DESCRIPTION OF THE SEVERAL VIEWS OF THE DRAWING

FIG. 3 is a circuit diagram depicting an example of the read circuit;

FIG. 4 is a view showing a structural example of an MTJ element;

FIG. 5 is a circuit diagram depicting an example of a control circuit and an internal circuit each;

FIG. 7 is a view showing a sequence according to an example of the present invention;

FIG. 12 is a circuit diagram depicting an example of a read circuit;

DETAILED DESCRIPTION OF THE INVENTION

A semiconductor memory of an aspect of the present invention will be described below in detail with reference to the accompanying drawings.

1. Overview

Embodiments of the present invention relate to a sequence for automatically providing setting of a data value in response to a reference cell for generating a reference electric potential during a read operation. Mainly, this sequence is used for a semiconductor memory for determining a data value of a memory cell by using a reference electric potential.

The following embodiments describe an example of a magnetic random access memory having a specific circumstance such that a state of a memory cell cannot be determined by carrying out a write operation as long as a read operation is not carried out in advance, among from such semiconductor memories.

2. EMBODIMENTS

Three embodiments which seem to be the best will be described here.

(1) First Embodiment

[1] Overview

Figure 1:
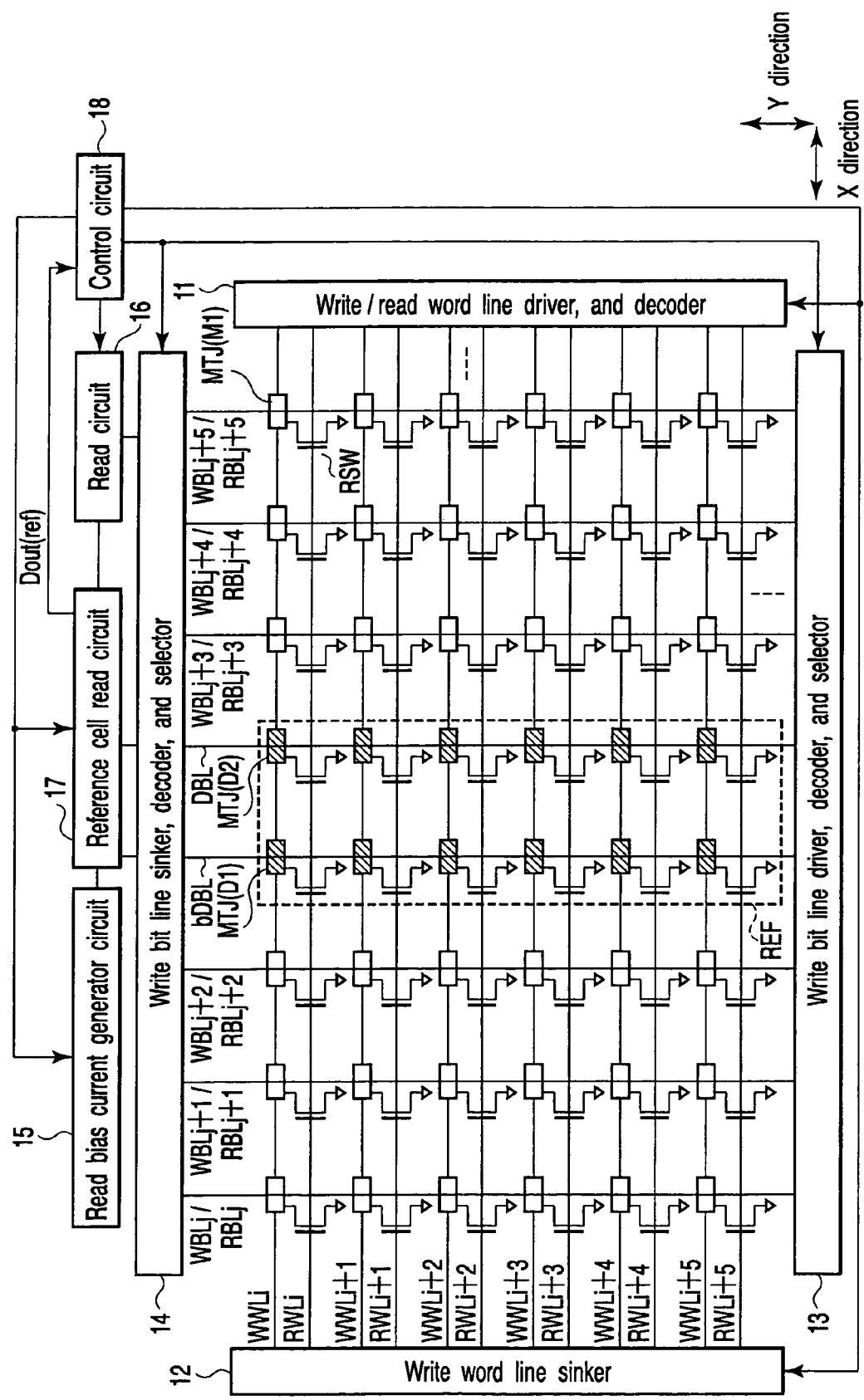
FIG. 1 is a block diagram depicting essential portions of an MRAM according to a first embodiment of the present invention.

FIG. 1 shows essential portions of a magnetic random access memory according to a first embodiment of the present invention.

A memory cell array has a one-transistor, one-MTJ type cell array structure. That is, one memory cell is composed of one read selector switch (transistor) RSW and one MTJ element MTJ.

On the memory cell array, there are allocated: write word lines WWLi, . . . and read word lines RWLi, . . . which extend in an X direction; and write/read bit lines WBLj/RBLj, . . . and reference bit lines DBL, bDBL which extend in a Y direction.

An MTJ element MTJ(M1) of a memory cell is allocated at a crossing portion between the write word lines WWLi, . . . and the write/read bit lines WBLj/RBLj, . . . . In addition, MJT elements MTJ(D1) and MTJ(D2) of reference cells are allocated at a crossing portion between the write word lines WWLi, . . . and reference bit lines DBL and bDBL.

The read word line RWLi, . . . is connected to the read selector switch RSW.

One end of each of the write word lines WWLi, . . . and the read word lines RWLi, . . . is connected to a write/read word line driver and decoder 11, and the other end of each of these lines is connected to a write word line sinker 12.

One end of each of the write/read bit lines WBLj/RBLj, . . . and reference bit lines DBL and bDBL is connected to a write bit line driver, decoder and selector 13, and the other end of each of these lines is connected to a write bit line sinker, decoder and selector 14.

A read bias current generator circuit 15 supplies a bias current to the MTJ elements MTJ(M1), MTJ(D1), and MTJ(D2) of each of the memory cell and reference cell connected to one read word line selected during a read operation.

A read circuit 16 includes a sense amplifier. This read circuit determines a data value of a selected memory cell based on a read electric potential generated from the memory cell selected as a reference electric potential generated from the reference cell during a read operation.

Here, in the present embodiment, in a chip, a reference cell read circuit 17 used for setting a data value in response to a reference cell is newly provided apart from a general read circuit 16.

The reference cell read circuit 17 has a function for setting an output signal Dout(ref) to "H" when a reference cell is set at a predetermined state.

For example, when the MTJ element MTJ(D1) connected to the reference bit line bDBL is set to "0" (an anti-parallel state with a high resistance value) and the MTJ element MTJ(D2) connected to the reference bit line DBL is set to "1" (a parallel state with a low resistance value), the reference cell read circuit 17 sets the output signal Dout(ref) to "H". In the other case, this read circuit sets the output signal Dout(ref) to "L".

A control circuit 18 controls a write/read operation using internal circuits 11 to 17 so that setting of a data value is reliably set in response to a reference cell in accordance with a sequence described later. This control operation is made, for example, until all settings of the MTJ element MTJ(D1) connected to the reference bit line bDBL become 0 and all settings of the MTJ element MTJ(D2) connected to the reference bit line DBL become "1".

[2] Read Circuit

Figure 2:
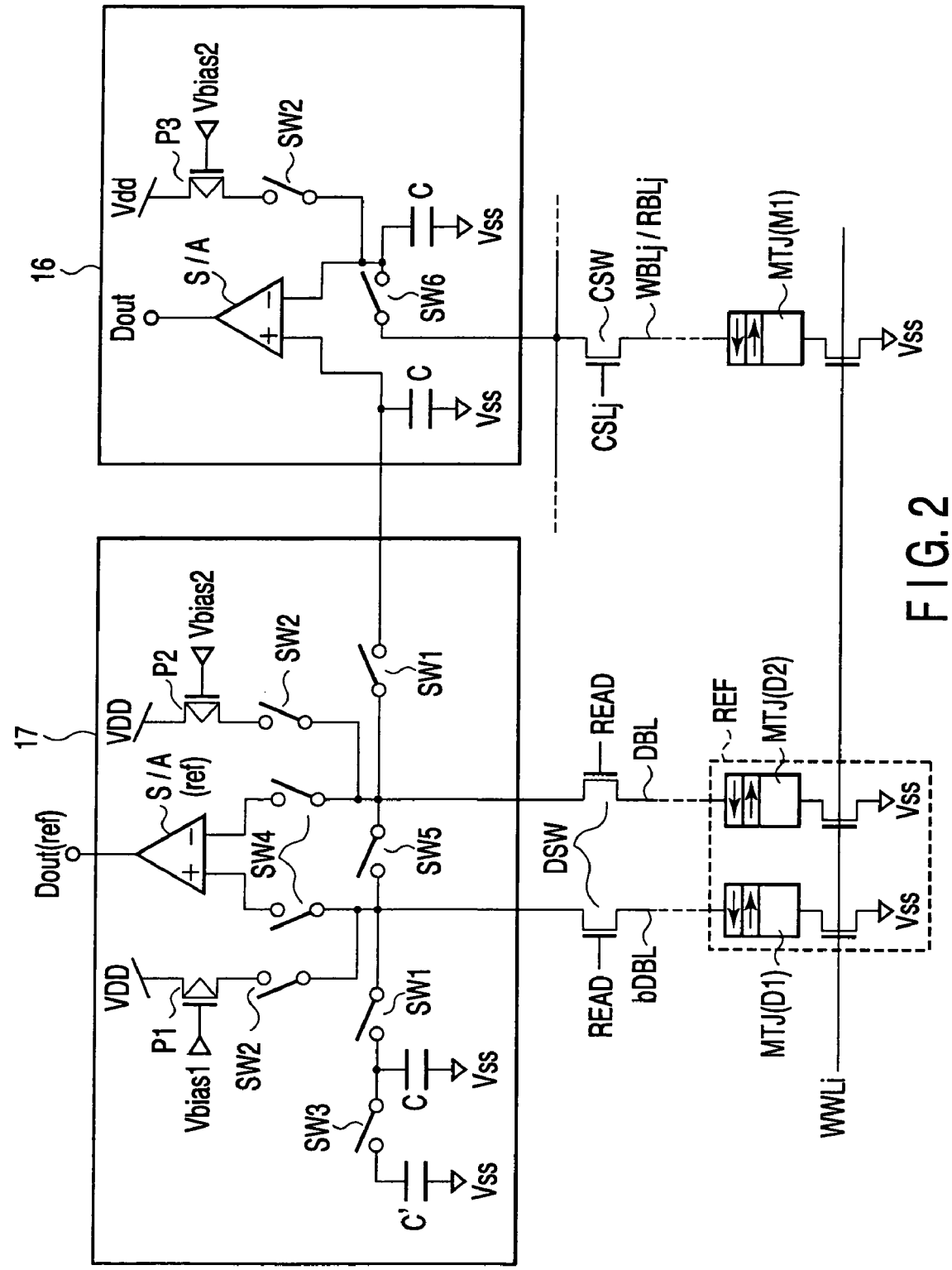
FIG. 2 is a circuit diagram depicting an example of a read circuit.

FIG. 2 is a circuit diagram showing an example of the read circuits 16, 17 in FIG. 1.

Before setting a data value, the states of the MTJ elements MTJ(D1) and MTJ(D2) of a reference cell REF, that is, whether or not an anti-parallel state or a parallel state is established is not known.

The reference cell read circuit 17 is used to grasp the state of the reference cell REF, wherein such an initial resistance value is not known. In the present embodiment, the reference cell read circuit 17 functions as a detector circuit for detecting whether or not the data value of the reference cell is set at a predetermined state instead of determining data in the reference cell.

In the present embodiment, the reference cell read circuit 17 sets the output signal Dout(ref) to "H" only when the MTJ element MTJ(D1) connected to the reference bit line bDBL is set to 0 and when the MTJ element MTJ(D2) connected to the reference bit line DBL is set to "1".

Namely, this reference cell read circuit 17 is used when carrying out a sequence for ensuring that all settings of the MTJ element MTJ(D1) connected to the reference bit line bDBL are 0 and that all settings of the MTJ element (MTJ(D2) connected to the reference bit line DBL are "1".

The reference bit line bDBL is connected to a capacitor C via a switch SW1 and is connected to a capacitor C' via switches SW1, SW3.

A source of a P-channel MOS transistor P1 serving as a current source is connected to a power supply terminal Vdd, and a drain is connected to the reference bit line bDBL via a switch SW2. A bias electric potential Vbias1 is input to a gate of the transistor P1.

The reference bit line DBL is connected to the capacitor C via the switch SW1. A source of a P-channel MOS transistor P2 serving as a current source is connected to the power supply terminal Vdd, and a drain is connected to the reference bit line DBL via the switch SW2. A bias electric potential Vbias2 is input to a gate of the transistor P2.

A positive input terminal of a sense amplifier S/A(ref) is connected to the reference bit line bDBL via a switch SW4. A negative input terminal of the sense amplifier S/A(ref) is connected to the reference bit line DBL via the switch SW4. A switch SW5 is connected between the reference bit lines DBL and bDBL.

On/off settings of the switches SW1 to SW5 are controlled by the control circuit 18 in FIG. 1 based on a sequence described later.

The read circuit 16 is used to read a data value of the MTJ element MTJ(M1) of a memory cell during a general read operation.

The positive input terminal of the sense amplifier is connected to the capacitor C, and is connected to the reference bit lines DBL and bDBL via the switches SW1, SW5. The negative input terminal of the sense amplifier S/A is connected to the capacitor C, and is connected to the write/read bit lines WBLj/RBLj via a switch SW6.

A source of a P-channel MOS transistor P3 serving as a current source is connected to the power supply terminal Vdd, and a drain is connected to the write/read bit lines WBLj/RBLj via the switches SW2, SW6. The bias electric potential Vbias2 is input to a gate of the transistor P3.

Here, in the present embodiment, although the sense amplifier S/A(ref) has been newly provided apart from a general read sense amplifier S/A, these amplifiers can be use in one combination.

For example, as shown in FIG. 3, the write/read bit lines WBLj/RBLj are connected to the negative input line of the sense amplifier S/A(ref) via the switch SW6. During a general read operation, when the switches SW1, SW2, SW41, SW5, and SW6 are set to on, and the switches SW3, SW42 are set to off, the data value of the MTJ element MTJ(M1) of the memory cell can be determined by the sense amplifier S/A(ref).

In FIGS. 2 and 3, the P-channel transistors P1, P2 supply an identical amount of current to the MTJ elements MTJ (D1) and MTJ(D2).

[3] MTJ Element

FIG. 4 shows a structural example of an MTJ element.

In the present embodiment, the MTJ element (tunnel magnetoresistive element) has a structure which corresponds to a toggle write system. A free layer (storage layer) 21 has a laminate ferry structure composed of a metal such as Ru and two ferromagnetic layers which sandwich the metal. These two ferromagnetic layer is weakly exchange-coupled with each other. In a state in which no magnetic field is applied, the magnetization directions of these layers are reversed from each other.

A tunnel insulating layer 22 is allocated between the free layer 21 and a pin layer (deposit layer) 23. The magnetization direction of the pin layer 23 is fixed. The anti-parallel or parallel state of the MTJ element is determined depending on a relationship between the magnetization direction of the ferromagnetic layer at the side of the tunnel insulating later 22 of the free layer 21 and the magnetization direction of the pin layer 23.

[4] Control Circuit and Write Circuit

Now, an example of a control circuit and a write circuit will be described here.

However, with respect to the write circuit, a general write circuit is not described here for clarity. That is, in the following, a description will be given with respect to only an example of a write circuit newly required to provide setting of a data value in response to a reference cell relating to an embodiment of the present invention.

FIG. 5 is a circuit diagram depicting an example of internal circuits 11 to 14 and a control circuit 18 in FIG. 1.

In the toggle write system, the state (data value) of the MTJ element has a feature that it is inverted every time a write operation is carried out. Thus, during a write operation, a write current is always fed in an identical direction to two write lines which are orthogonal to each other, whatever write data may be.

In the present embodiment, during a write operation, to the write word line WWLi, a write current is fed in a direction oriented from the write word line driver 11 to the write word line sinker 12.

The write word line driver 11 has: a current source I1; current mirror circuits (P-channel MOS transistors) P4 and P5 for introducing a write current generated by the current source I1 into the write word line WWLi; a transfer gate (P-channel MOS transistor P6); and an NAND gate circuit ND3 serving as a decoder.

The write word line sinker 12 is composed of an N-channel MOS transistor N1 and an AND gate circuit AD1 serving as a decoder.

In addition, during a write operation, to the reference bit lines DBL and bDBL, a write current is fed in a direction oriented from the write bit line driver 13 to the write bit line sinker 14.

The write bit line driver 13 has: a current source I2; current mirror circuits (P-channel MOS transistors) P7 and P8 for introducing the write current generated by the current source I2 into the reference bit lines DBL and bDBL; and transfer gates (P-channel MOS transistors) P9 and P10.

The write bit line sinker 14 is composed of an N-channel MOS transistor N2.

The control circuit 18 controls operations of the internal circuits 11 to 17 in order to execute setting of a data value in response to a reference cell relating to an embodiment of the present invention.

In the present embodiment, the control circuit 18 has a controller 19 and a delay type flip-flop circuit (D-F/F) 20.

The controller 19 having received start signal START="H", sets a write signal WRITE to "H" and outputs a clock signal CLK and a reset signal RST at a predetermined timing. The start signal START serves as a signal which is set to "H" during a write operation in response to a reference cell.

The delay type flip-flop circuit 20 receives a clock signal CLK and a reset signal RST and outputs a pulse signal POUT at a predetermined timing.

This pulse signal POUT is received by a logic circuit which includes: NAND gate circuits ND1 and ND2; a NOR gate circuit NR1; and inverter circuits INV1, INV2, INV3, and INV4 to control a write current fed to the write word line WWLi and reference bit lines DBL and bDBL.

In the following embodiment, an output signal of one of the NAND gate circuits ND1 and ND2 is set to "H", and the other output signal is set to "L". Thus, a write current is fed to only one of the reference bit lines DBL and bDBL.

At this time, a write current is fed to the write word line WWLi selected in response to a row address signal ADDi. With respect to the low address signal ADDi, all the bits of the row address signal ADDi of the selected row are set to "H".

As described later, in a sequence for setting a data value in response to a reference cell relating to an embodiment of the present invention, a write operation is carried out alternately for the MTJ elements MTJ(D1) and MTJ(D2) until the MTJ elements MTJ(D1) and MTJ(D2) have been established in their predetermined states.

The write circuit of the present embodiment has a function for alternately carrying out a write operation for the MTJ elements MTJ(D1) and MTJ(D2).

Figure 6:
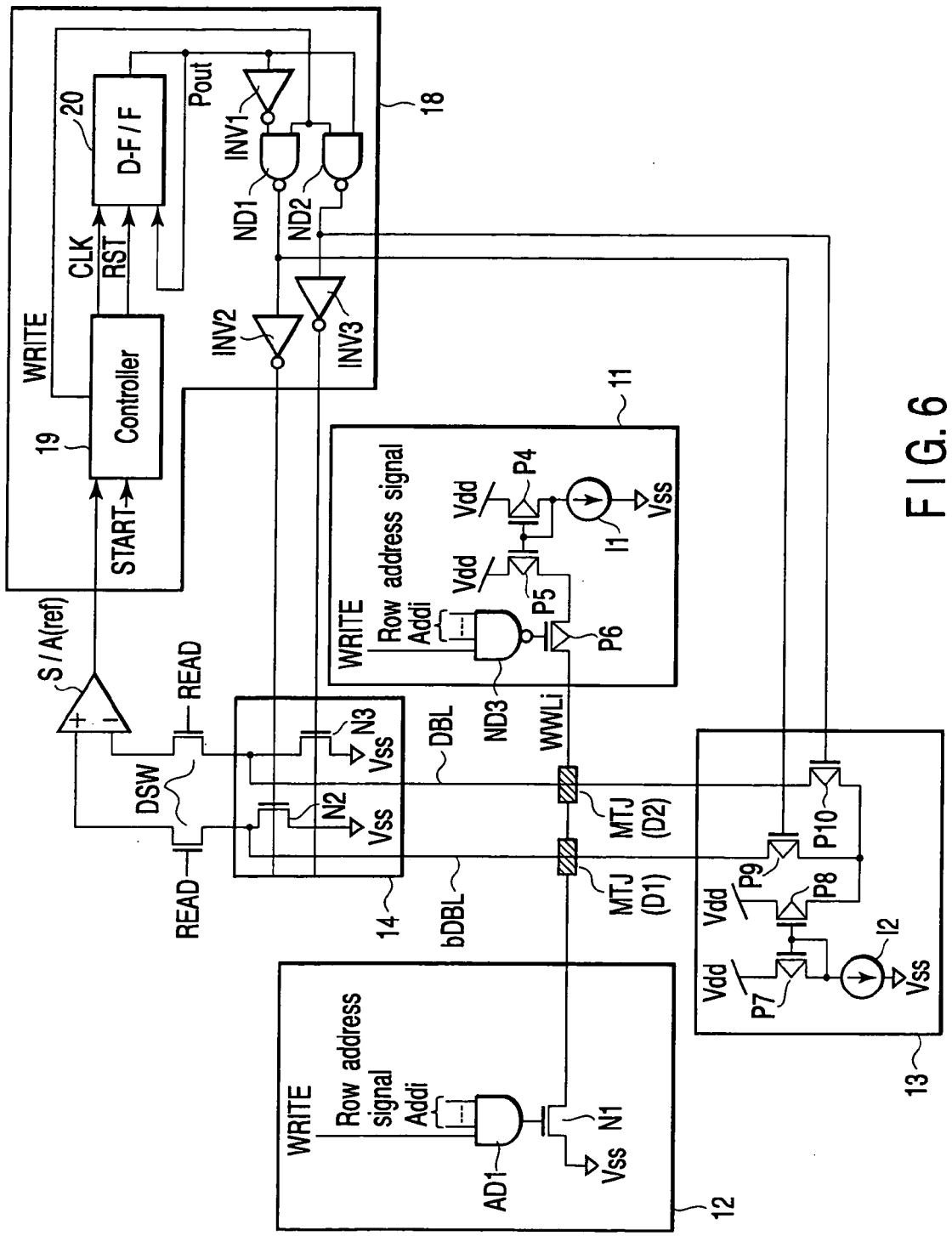
FIG. 6 is a circuit diagram depicting an example of the control circuit and the internal circuit each.

FIG. 6 shows a modified example of the exemplary circuits in FIG. 5.

This modified example is featured in that the write signal WRITE has been input to the NAND gate circuit ND3 in the write word line driver 11 and the write signal WRITE has been input to the AND gate circuit AD1 in the write word line sinker 12.

The other constituent elements are identical to those in the circuit diagram of FIG. 5.

[5] Setting Data Value in Response to Reference Cell

Now, a sequence for setting a data value in response to a reference cell will be described below.

The present embodiment describes a sequence for setting the state of the reference cell connected to the reference bit line bDBL in FIG. 1 to "0", and the state of the reference cell connected to the reference bit line DBL to "1".

As a reference cell read circuit, the circuit shown in FIG. 2 or 3 is used. As the other internal circuit, the circuit shown in FIG. 5 or 6 is used.

Here, with respect to the reference cell read circuit shown in FIG. 2 or 3, only when the MTJ element MTJ(D1) is set to "0" and the MTJ element MTJ(D2) is set to "1", the sizes of the capacitors C and C' are set in advance as follows so that the output signal Dout(ref) of the sense amplifier S/A(ref) is set to "H":

$$Rp \times C/(C+C') \times I < Rp \times I < Ra \times C/(C+C') \times I < Ra \times I \quad (1)$$

where Ra (=R+ΔR) is a resistance value of the MTJ element which is set to "0"; Rp (=R) is a resistance value of the MTJ element which is set to "1"; C is a capacitance of the capacitor C; C' is a capacitance of the capacitor C'; and I is a value of a read current fed to the MTJ element.

FIG. 7 shows a sequence for setting a data value in response to a reference cell relating to an embodiment of the present invention.

There are N row addresses. A data value is set in response to a reference cell on a row by row basis. In addition, the settings of the data values is assumed to start from a row address row1 and end at a row address row N.

First, data in the MTJ elements MTJ(D1) and MTJ(D2) which belong to the first row address row1 are read (step ST1).

In this a read operation, the switches SW1 to SW5 in the reference cell read circuit 17 in FIG. 2 or 3 are controlled as follows.

The switch SW1 and SW2 are turned on; bias electric potentials Vbias1 and Vbias2 are applied to the transistors P1 and P2; and a charge is stored in the capacitor C while the read current (bias current) I is fed to the MTJ elements MTJ(D1) and MTJ(D2) each.

Then, the switch SW2 is turned off, and the read current I is interrupted.

Then, the switches SW1, SW3, and SW4 are turned on, and the electric potentials of a pair of reference bit lines DBL and bDBL are compared with each other by the sense amplifier S/A(ref).

The output result of the sense amplifier S/A(ref) which is presumed by this comparison of the electric potentials is classified into the following four cases according to the initial states of the MTJ elements MTJ(D1) and MTJ(D2), as shown in Table 1.

TABLE 1

| D1 | D2 | | Dout(ref) |
|---|---|---|---|
| Ra | Rp | C > B | "H" |
| Rp(Ra) | Rp | A < B | "L" |
| Rp(Ra) | Ra | A < D | "L" |
| Ra(Rp) | Ra | C > D | "L" |
| A | B | C | D |

$$Rp \times \frac{C}{C+C'} I < Rp \times I < Ra \times \frac{C}{C+C'} I < Ra \times I$$

CASE 1: When the reference value of D1 is Ra and the reference value of D2 is Rp, Dout(ref) is set to "H".
CASE 2: When the reference value of D1 is Rp and the reference value of D2 is Rp, Dout(ref) is set to "L".
CASE 3: When the reference value of D1 is Rp and the reference value of D2 is Ra, Dout(ref) is set to "L".
CASE 4: When the reference value of D1 is Ra and the reference value of D2 is Ra, Dout(ref) is set to "L".

In CASE 1, Dout(ref) is set to "H", and the MTJ elements MTJ(M1) and MTJ(M2) are already set at their target data values. Then, it is checked whether or not all the settings of reference cells have been terminated. In the case where the check result is affirmative, normal end of the task is established. In the case where the check result is negative, setting of a data value is provided again by increasing a row address by 1 (steps ST1 and ST10 to ST11).

In CASE 2, CASE 3, or CASE 4, Dout(ref) is set to "L", and the MTJ elements MTJ(D1) and MTJ(D2) are not set at their target data values. Therefore, only one write operation is carried out for the MTJ element MTJ(D1) (step ST3)

As a result, the data values of the MTJ(D1) in CASE 2, CASE 3, and CASE 4 are inverted respectively as shown in the parentheses of Table 1.

Then, data in the MTJ elements MTJ(D1) and MTJ(D2) of reference cells belonging to the row address row1 are read (step ST4).

The output result of the sense amplifier S/A(ref) is classified into the following three cases according to the states of the MTJ elements MTJ(D1) and MTJ(D2).

TABLE 2

| D1 | D2 | | Dout(ref) |
|---|---|---|---|
| Ra | Rp | C > B | "H" |
| Ra | Ra(Rp) | C < D | "L" |
| Rp | Ra(Rp) | A < D | "L" |
| A | B | C | D |

$$Rp \times \frac{C}{C+C'} I < Rp \times I < Ra \times \frac{C}{C+C'} I < Ra \times I$$

CASE 1: When the reference value of D1 is Ra and the reference value of D2 is Rp, Dout(ref) is set to "H".
CASE 2: When the reference value of D1 is Ra and the reference value of D2 is Ra, Dout(ref) is set to "L".
CASE 3: When the reference value of D1 is Rp and the reference value of D2 is Ra, Dout(ref) is set to "L".

In CASE 1, Dout(ref) is set to "H", and thus, it is found that the MTJ elements MTJ(D1) and MTJ(D2) have been set at their target data values. Then, it is checked whether or not all the settings of reference cells have been terminated. In the case where the check result is affirmative, normal end of the task are established. In the case where the check result is negative, setting of a data value is provided again by increasing a row address by 1 (steps ST5 and ST10 to ST11).

In CASE 2 and CASE 3, Dout(ref) is set to "L", and the MTJ elements MTJ(D1) and MTJ(D2) are not set at their target data values. Then, only one write operation is carried out for the MTJ element MTJ(D2) (step ST6).

As a result, the data values of the MTJ element MTJ(D2) in CASE 2 and CASE 3 are inverted respectively as shown in the parentheses of Table 2.

Then, data in the MTJ elements MTJ(D1) and MTJ(D2) of reference cells belonging to the row address row1 are read again (step ST7).

The output result of the sense amplifier S/A(ref) is classified into the following two cases according to the states of the MTJ elements MTJ(D1) and MTJ(D2), as shown in Table 2.

TABLE 3

| D1 | D2 | | Dout(ref) |
|---|---|---|---|
| Ra | Rp | C > B | "H" |
| Rp(Ra) | Rp | A < B | "L" |
| A | B | C | D |
| $Rp \times \frac{C}{C+C'} I < Rp \times I < Ra \times \frac{C}{C+C'} I < Ra \times I$ | | | |

CASE 1: When the reference value of D1 is Ra and the reference value of D2 is Rp, Dout(ref) is set to "H".

CASE 2: When the reference value of D1 is Rp and the reference value of D2 is Rp, Dout(ref) is set to "L".

In CASE 1, Dout(ref) is set to "H", and it is found that the MTJ elements MTJ(D1) and MTJ(D2) have been set at their target values. Then, it is checked whether or not all the setting of reference cells have been terminated. In the case where the check result is affirmative, normal end of the task are established. In the case where the check result is negative, setting of a data value is provided again by increasing a row address by 1 (steps ST8 and ST10 to St11).

In CASE 2, Dout(ref) is set to "L", and the MTJ elements MTJ(D1) and MTJ(D2) are not set at their target data values. Then, only one write operation is carried out the MTJ element MTJ(D1) (step ST9).

As a result, the data value of the MTJ element MTJ(D1) in CASE 2 is inverted as shown in the parenthesis of Table 3.

Here, with respect to CASE 2, as a result of inverting the data value of the MTJ element MTJ(D1), as shown in Table 4, the resistance value of the MTJ element MTJ(D1) is Ra, and the resistance value of the MTJ element MTJ(D2) is Rp. These resistance values are set at their target data values.

TABLE 4

| D1 | D2 | | Dout(ref) |
|---|---|---|---|
| Ra | Rp | C > B | "H" |
| A | B | C | D |
| $Rp \times \frac{C}{C+C'} I < Rp \times I < Ra \times \frac{C}{C+C'} I < Ra \times I$ | | | |

When this stage has been reached, the data values of MTJ elements MTJ(D1) and MTJ(D2) reach their target values (resistance value of MTJ(D1): Ra and resistance value of MTJ(D2): Rp) whatever the initial states of the MTJ elements MTJ(D1) and MTJ(D2) may be.

Therefore, it is then checked whether or not all the settings of reference cells have been terminated. In the case where the check result is affirmative, normal end of the task is established. In the case where the check result is negative, setting of a data value is provided again by increasing a row address by 1 (steps ST10 to ST11).

As has been described above, according to the sequence for setting a data value in response to a reference cell relating to the embodiment of the invention, a data value can be automatically set in response to a reference cell reliably, within a short period of time, and automatically. Therefore, a burden on a die sort test process by this setting can be reduced, reduction of a manufacturing cost can be achieved.

In the meantime, according to the above-described sequence of the present invention, the setting of a data value can be terminated in the following order according to the initial states of the MTJ elements MTJ(D1) and MTJ(D2).

Case A in Which Setting Terminates Earliest

When the initial state of the MTJ element MTJ(D1) is "0" (resistance value Ra) and the initial state of the MTJ element MTJ(D2) is "1" (resistance value Rp), setting is completed without any write operation.

Case B in Which Setting Terminates Second Earliest

When the initial state of the MTJ element MTJ(D1) is "1" (resistance value Rp) and the initial state of the MTJ element MTJ(D2) is "1" (resistance value Rp), setting is completed by only one write operation in response to the MTJ element MTJ(D1).

Case C in Which Setting Terminates Third Earliest

When the initial state of the MTJ element MTJ(D1) is "1" (resistance value Rp) and the initial state of the MTJ element MTJ(D2) is "0" (resistance value Ra), setting is completed by a total of two write operations, i.e., by one write operation in response to the MTJ element MTJ(D1) and one write operation in response to the MTJ element MTJ(D2).

Case D in Which Setting Terminates Lastly

When the initial state of the MTJ element MTJ(D1) is "0" (resistance value Ra) and the initial state of the MTJ element MTJ(D2) is "0" (resistance value Ra), setting is completed by a total of three write operations, i.e., by two write operations in response to the MTJ element MTJ(D1) and one write operation in response to the MTJ element MTJ(D2).

Of course, the initial states of the MTJ elements MTJ(D1) and MTJ(D2) are different from each other, and therefore, either of them cannot be selected. However, the setting of a data value in response to a reference cell terminates earlier in ascending order of A, B, C, and D.

[6] General Read Operation

A general read operation is described as follows.

In the case where the read circuit of FIG. 2 is used, the switches SW1, SW2, and SW5 are turned on, and the switches SW3 and SW4 are turned off, thereby applying a read current (bias current) to the MTJ elements MTJ(D1) and MTJ(D2) of reference cells.

Here, the switch SW5 is turned on, and the MTJ elements MTJ(D1) and MTJ(D2) of two reference cells are shorted out. A just intermediate electric potential between a read electric potential obtained by the MTJ element which is set to "0" and a read electric potential obtained by the MTJ element which is set to "1" can be applied to the positive input terminal of the sense amplifier S/A in the read circuit 16.

Further, since the switches SW2 and SW6 are turned on at the read circuit 16, a read current (bias current) is supplied to the MTJ element MTJ(M1). The read electric potential obtained by the MTJ element MTJ(M1) is input to the negative input terminal of the sense amplifier S/A in the read circuit 16.

In the case where the read circuit of FIG. 3 is used, the switches SW1, SW2, SW41, and SW5 are turned on, and the switches S3 and S42 are turned off, thereby applying a read current (bias current) to the MTJ elements MTJ(D1) and MTJ(D2) of reference cells.

Here, the switch SW5 is turned on, and the MTJ elements MTJ(D1) and MTJ(D2) of two reference cells are shorted out. Thus, a just intermediate electrical potential between the read electric potential obtained by the MTJ element which is set to "0" and the read electric potential obtained by the MTJ element which is set to "1" can be applied to the positive input terminal of the sense amplifier S/A(ref) in the read circuit 17.

In addition, during a general read operation, since the switches SW2 and SW6 are turned on, the read current (bias current) is supplied to the MTJ element MTJ(M1). The read electric potential obtained by the MTJ element MTJ(M1) is input to the negative input terminal of the sense amplifier S/A(ref) in the read circuit 17.

[7] Summary

As has been described above, according to the first embodiment, there is proposed a sequence for automatically provide setting of a data value in response to a reference cell for generating a reference electric potential during a read operation. This setting can reduce a burden on a die sort process, and can achieve reduction of a manufacturing cost.

In this sequence a maximum effect can be attained by applying the present invention to a magnetic random access memory which uses a toggle write system having a special circumstance such that a state of a memory cell by a write operation cannot be determined unless a read operation has been carried out in advance.

(2) Second Embodiment

The present embodiment relates to a sequence for setting a data value in response to a reference cell relating to an embodiment of the present invention. The present embodiment is featured in that detection of whether or not data in a reference cell is set to its target value is carried out by adjusting a bias current applied to an MTJ element.

[1] Overview

Figure 8:
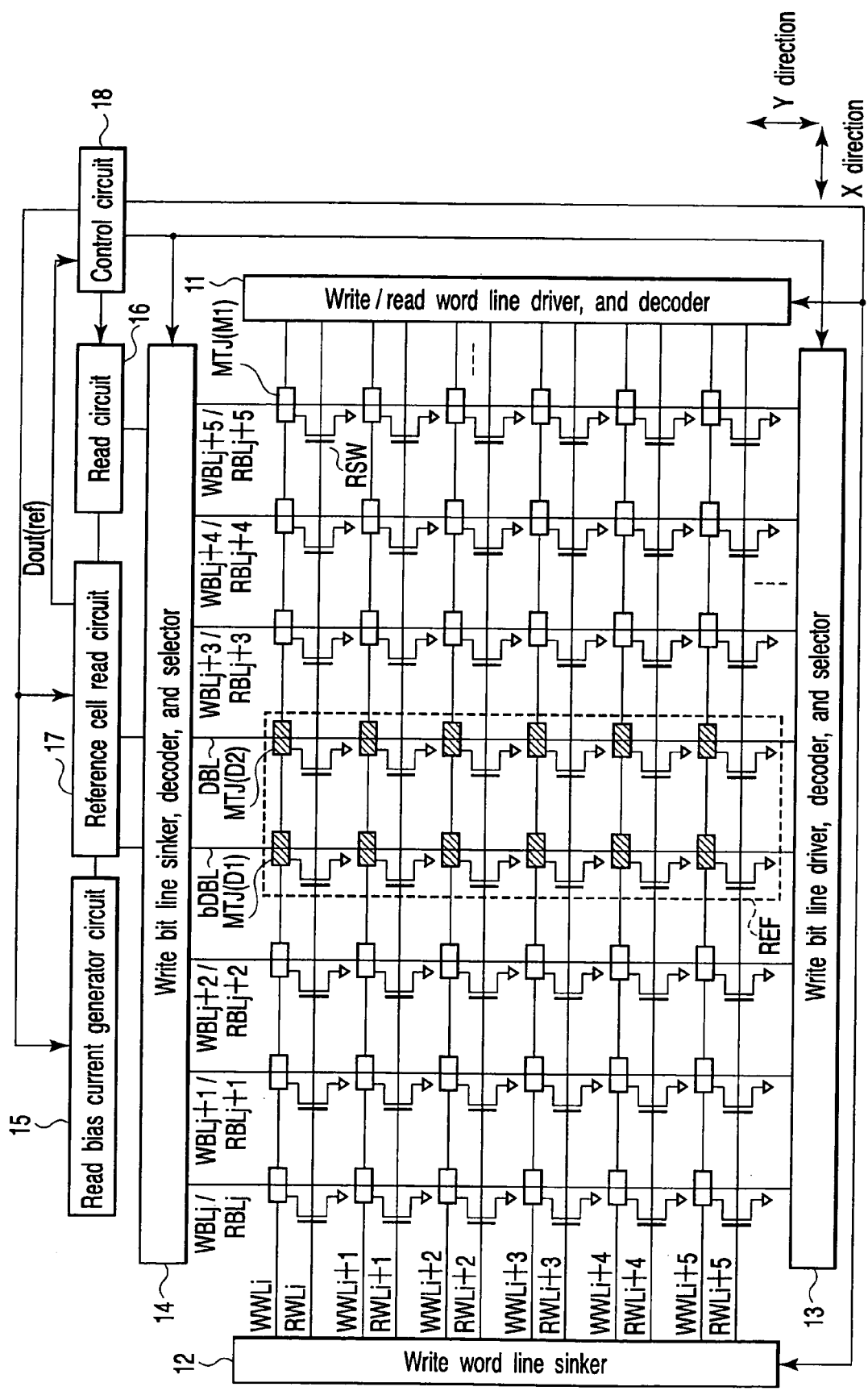
FIG. 8 is a block diagram depicting essential portions of an MRAM according to a second embodiment of the present invention.

FIG. 8 shows essential portions of a magnetic random access memory according to a second embodiment of the present invention.

The overview is identical to that of the magnetic access memory shown in FIG. 1. A detailed description is omitted here.

In the present embodiment, when a data value is set in response to a reference cell, a read current (bias current) applied to the MTJ element is adjusted by using the reference cell read circuit 17, and it is detected whether or not the MTJ element connected to the reference bit line bDBL is set to "0", and the MTJ element connected to the reference bit line DBL is set to "1".

[2] Read Circuit

Figure 9:
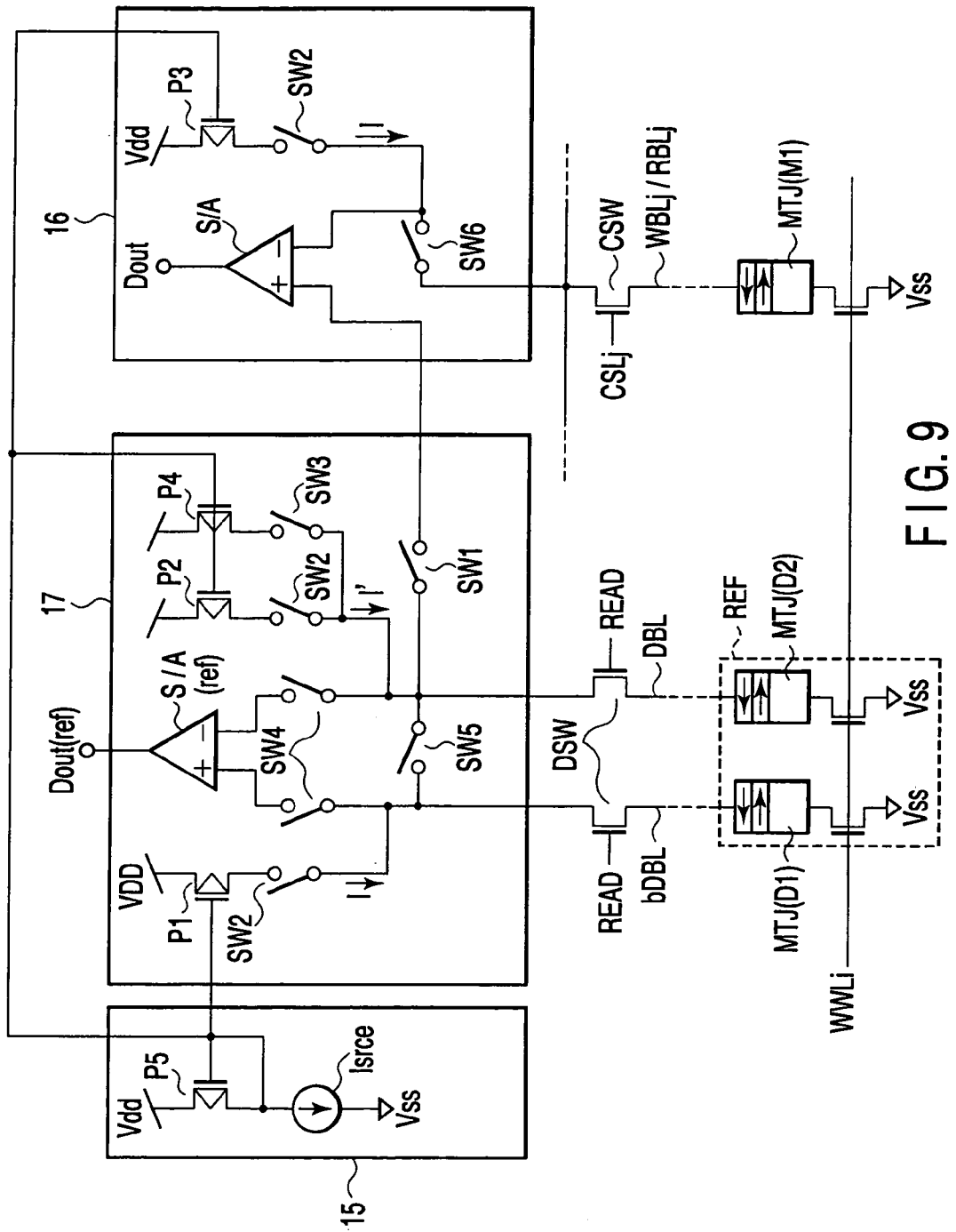
FIG. 9 is a circuit diagram depicting an example of a read circuit.

FIG. 9 is a circuit diagram depicting an example of a bias current generator circuit 15 and read circuits 16 and 17 in FIG. 8.

As has already been described, before setting a data value, it is unknown as to whether the MTJ elements MTJ(D1) and MTJ (D2) of reference cells REF are set at an anti-parallel state or a parallel state.

The reference cell read circuit 17 is used to grasp such a state of a reference cell REF in which no initial reference value is known. In the present embodiment as well, the reference cell read circuit 17 functions as a detector circuit for detecting whether or not a data value of a reference cell is set at a predetermined state instead of determining data in a reference cell.

For example, the reference cell read circuit 17 functions to set the output signal Dout(ref) to "H" only when the MRJ element MTJ(D1) connected to the reference bit line bDBL is set to 0 and when the MTJ element MTJ(D2) connected to the reference bit line DBL is set to "1".

The reference bit line bDBL is connected to a positive input terminal of a sense amplifier S/A in a general read circuit 16 via a switch SW1.

A source of a P-channel MOS transistor P1 serving as a current source is connected to a power supply terminal Vdd, and a drain is connected to the reference bit line bDBL via a switch S2. The transistor P1 configures a current mirror circuit together with a P-channel MOS transistor P5.

A source of a P-channel transistor P2 serving as a current source is connected to the power supply terminal Vdd, and a drain is connected to the reference bit line DBL via the switch SW2. In addition, a source of a P-channel MOS transistor P4 serving as a current source is connected to the power supply terminal Vdd, and a drain is connected to the reference bit line DBL via s switch SW3. The transistors P2 and P4 each configure a current mirror circuit together with the P-channel MOS transistor P5.

Here, for example, the sizes (conductance) of the transistors P1, P2, and P4 are set to be equal to each other. In this case, assuming that a constant current I is generated by a constant current source Isrce in the read bias current generator circuit 15, a bias current I is fed to the transistor P1, and the current is fed to the MTJ element MTJ(D1).

In addition, assuming that the constant current I is generated by the constant current source Isrce in the read bias current generator circuit 15, for example, the current I is fed to the transistors P2 and P4 each. Thus, a total of I' (=2I) bias currents are supplied to the MTJ element MTJ(D2).

The positive input terminal of the sense amplifier S/A(ref) is connected to the reference bit line bDBL via the switch SW4, and the negative input terminal of the sense amplifier S/A(ref) is connected to the reference bit line DBL via the switch SW4. The switch SW5 is connected between the reference bit lines DBL and bDBL.

On/off settings of the switches SW1 to SW5 are controlled by means of the control circuit in FIG. 8 based on the sequence shown in FIG. 7 as in the above-described first embodiment.

The read circuit 16 is used to read a data value of the MTJ element MTJ(M1) of a memory cell during a general read operation.

The positive input terminal of the sense amplifier S/A is connected to the reference bit lines DBL and bDBL via the switches SW1 and SW5. In addition, the negative input terminal of the sense amplifier S/A is connected to the write/read bit line WBLi/RBLj via the switch SW6.

A source of a P-channel MOS transistor P3 serving as a current source is connected to the power supply terminal Vdd, and a drain is connected to the write/read bit line WBLj/RBLj via the switches SW2 and SW6. The transistor P3 configures a current mirror circuit together with the P-channel MOS transistor P5.

The sizes (conductance) of the transistors P3 and P5 are set to be equal to each other. Thus, assuming that a constant current I is generated by the constant current source Isrce in the bias current generator circuit 15, a bias current I is fed to the transistor P3, and this current is supplied to the MTJ element MTJ(M1).

In the present embodiment, although a sense amplifier S/A(ref) has been newly provided apart from a sense amplifier for a general read operation, both of them can be used in one combination.

Figure 10:
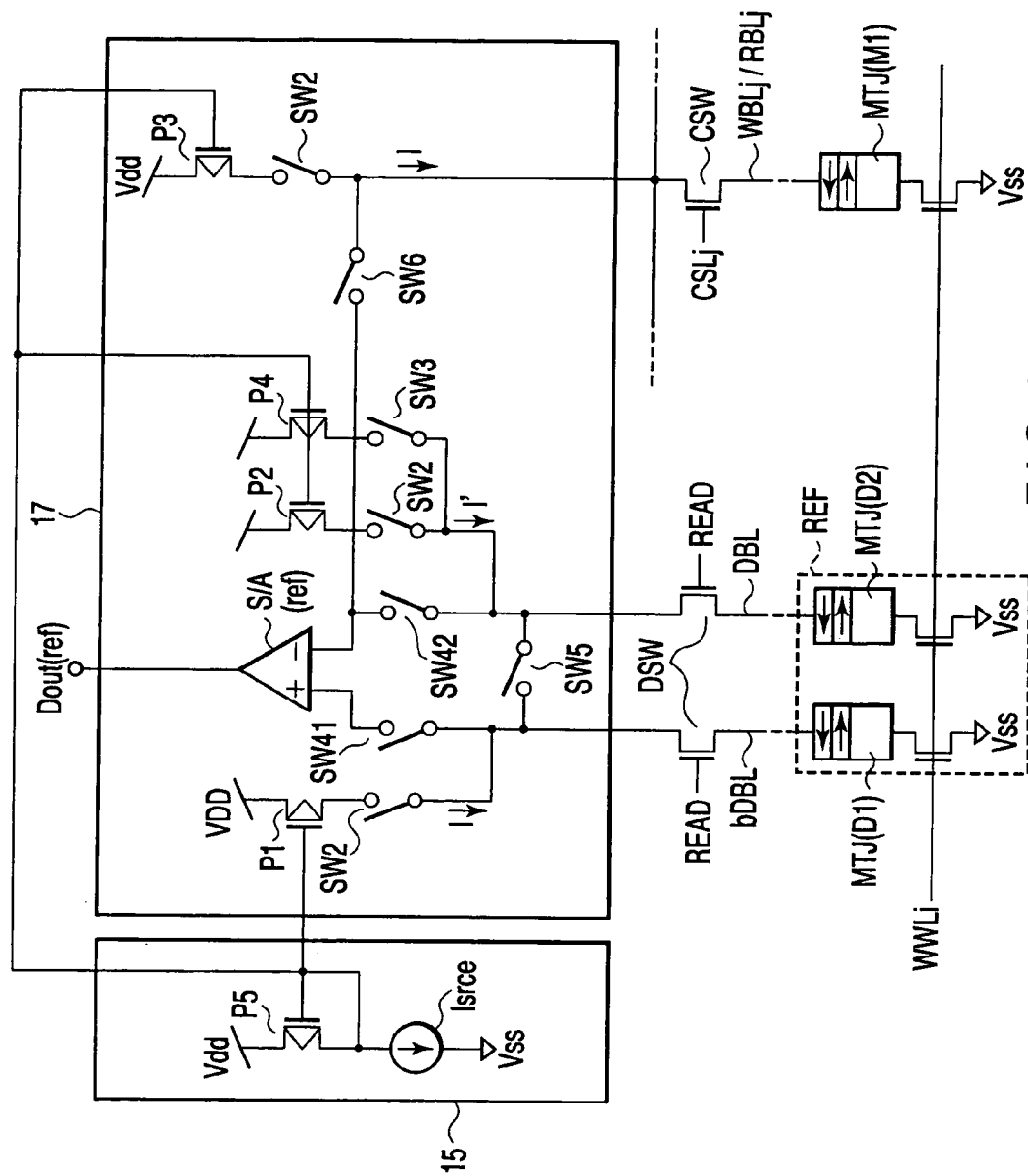
FIG. 10 is a circuit diagram depicting an example of the read circuit.

For example, as shown in FIG. 10, the write/read bit line WBLj/RBLj can be connected to the negative input terminal of the sense amplifier S/A(ref) via the switch SW6.

In this case, during a general read operation, the switches SW1, S2, SW41, SW5, and SW6 are turned on, and the switches SW3 and SW42 are turned off. In this manner, a data value of the MTJ element MTJ(M1) of a memory cell can be determined by using the sense amplifier S/A(ref).

[3] Control Circuit and Write Circuit

A control circuit and a write circuit shown in FIG. 5 or 6 can be used as they are.

[4] Setting Data Value in Response to Reference Cell

Now, a sequence for setting a data value in response to a reference cell will be described below.

In the present embodiment, a description will be given with respect to a sequence for setting to "0" a state of a reference cell connected to a reference bit line bDBL and setting to "1" a state of a reference cell connected to a reference bit line DBL in FIG. 8.

As a reference cell read circuit, the circuit shown in FIG. 9 or 10 is used. As the other internal circuit, the circuit shown in FIG. 5 or 6 is used.

Here, with respect to the reference cell read circuit in FIG. 9 or 10, only when the MTJ element MTJ(D1) is set to "0" and when the MTJ element MTJ(D2) is set to "1", the sizes of the transistors P1, P2, and P4, i.e., the sizes of the bias currents I and I' are set in advance as follows so that an output signal Dout(ref) of the sense amplifier S/A(ref) is set to "H":

$$I \times Rp < I' \times Rp < I \times Ra < I' \times Ra \quad (2)$$

wherein Ra (=R+ΔR) is a reference value of an MTJ element which is set to "0"; Rp (=R) is a reference value of an MTJ element which is set to "1"; I is a bias current applied to the MTJ element MTJ(D1); and I' (>I) is a bias current applied to the MTJ element MTJ(D2).

A sequence for setting a data value in response to a reference cell is completely the same as that of the first embodiment, as shown in FIG. 7.

There are N row addresses, and the setting of a data value in response to a reference cell is carried out on a row by row basis. In addition, the setting of the data value starts from a row address row1 and ends with a row address row N.

First, data in the MTJ elements MTJ(D1) and MTJ(D2) of reference cells belonging to the first row address row1 are read (step ST1).

In this a read operation, the switches SW2 and SW3 are turned on, and the switches SW1, SW4, SW5, an SW6 are turned off. By using the reference cell read circuit 17 in FIG. 9 or 10, the bias current I is supplied to the MTJ element MTJ(D1), and the bias current I' is supplied to the MTJ element MTJ(D2).

Then, the switches SW2 and SW3 are turned off, and the bias currents I and I' are interrupted.

Then, the switch SW4 is turned on, and a comparison in electric potentials between a pair of reference bit lines DBL and bDBL is made by the sense amplifier S/A(ref).

The output result of the sense amplifier S/A(ref) presumed by this comparison in electronic potentials is classified into the following four cases according to the initial states of the MTJ elements MTJ(D1) and MTJ (D2).

TABLE 5

| D1 | D2 | | Dout(ref) |
|---|---|---|---|
| Ra | Rp | C > B | "H" |
| Rp(Ra) | Rp | A < B | "L" |
| Rp(Ra) | Ra | A < D | "L" |
| Ra(Rp) | Ra | C > D | "L" |
| A | B | C | D |
| | $I \times Rp < I' \times Rp < I \times Ra < I' \times Ra$ | | |

CASE 1: When the resistance value of D1 is Ra and the resistance value of D2 is Rp, Dout(ref) is set to "H".

CASE 2: When the resistance value of D1 is Rp and the resistance value of D2 is Rp, Dout(ref) is set to "L".

CASE 3: When the resistance value of D1 is Rp and the resistance value of D2 is Ra, Dout(ref) is set to "L".

CASE 4: When the resistance value of D1 is Ra and the resistance value of D2 is Ra, Dout(ref) is set to "L".

As in the first embodiment, in CASE 1, Dout(ref) is set to "H". In CASE 2, CASE 3, and CASE 4, Dout(ref) is set to "L". When Dout(ref) is set to "L", only one write operation is carried out for the MTJ element MTJ(D1) (steps ST2, ST3, and ST10 to ST10).

As a result, as shown in the parentheses of Table 5, the data values of the MTJ element MTJ(D1) in CASE 2, CASE 3, and CASE 4 are inverted, respectively.

Then, data in the MTJ elements MTJ(D1) and MTJ(D2) of reference cells belonging to the row address row1 are read (step ST4).

The output result of the sense amplifier S/A(ref) is classified into the following three cases according to the states of the MTJ elements MTJ(D1) and MTJ(D2), as shown in Table 6.

TABLE 6

| D1 | D2 | | Dout(ref) |
|---|---|---|---|
| Ra | Rp | C > B | "H" |
| Ra | Ra(Rp) | C < D | "L" |
| Rp | Ra(Rp) | A < D | "L" |
| A | B | C | D |
| | $I \times Rp < I' \times Rp < I \times Ra < I' \times Ra$ | | |

CASE 1: When the resistance value of D1 is Ra and the resistance value of D2 is Rp, Dout(ref) is set to "H".

CASE 2: When the resistance value of D1 is Ra and the resistance value of D2 is Ra, Dout(ref) is set to "L".

CASE 3: When the resistance value of D1 is Rp and the resistance value of D2 is Ra, Dout(ref) is set to "L".

As in the first embodiment, in CASE 1, Dout(ref) is set to "H". In CASE 2 and CASE 3, Dout(ref) is set to "L". When Dout(ref) is set to "L", only one write operation is carried out for the MTJ element MTJ(D1) (steps ST5, ST6, and ST10 to ST11).

As a result, as shown in the parentheses of Table 6, the data values of the MTJ element MTJ(D2) in CASE 2 and CASE 3 are inverted, respectively.

Then, data in the MTJ elements MTJ(D1) and MTJ(D2) of reference cells belonging to the row address row1 are read again (step ST7).

The output result of the sense amplifier S/A(ref) is classified into the following two cases according to the states of the MTJ elements MTJ(D1) and MTJ(D2), as shown in Table 7.

TABLE 7

| D1 | D2 | | Dout(ref) |
|---|---|---|---|
| Ra | Rp | C > B | "H" |
| Rp(Ra) | Rp | A < B | "L" |
| A | B | C | D |
| | I × Rp < I' × Rp < I × Ra < I' × Ra | | |

CASE 1: When the resistance value of D1 is Ra and the resistance value of D2 is Rp, Dout(ref) is set to "H".

CASE 2: When the resistance value of D1 is Rp and the resistance value of D2 is Rp, Dout(ref) is set to "L".

As in the first embodiment, in CASE 1, Dout(ref) is set to "H". In CASE 2, Dout(ref) is set to "L". When Dout(ref) is set to "L", only one write operation is carried out for the MTJ element MTJ(D1) (steps ST8 and ST9 to ST11).

As a result, as shown in the parentheses of Table 7, the data value of the MTJ element MTJ(D1) in CASE 2 is inverted.

Here, with respect to CASE 2, as a result of inverting the data value of the MTJ element MTJ(D1), as shown in Table 8, the resistance value of the MTJ element MTJ(D1) is set to Ra, and the resistance value of the MTJ element MTJ(D2) is set to Rp. These resistance values are set at the target data values.

TABLE 8

| D1 | D2 | | Dout(ref) |
|---|---|---|---|
| Ra | Rp | C > B | "H" |
| A | B | C | D |
| | I × Rp < I' × Rp < I × Ra < I' × Ra | | |

That is, when this stage has been reached, the data values of the MTJ elements MTJ(D1) and MTJ(D2) always reach the target value (resistance value of MTJ(D1): Ra and resistance value of MTJ(D2): Rp) whatever the initial state of the MTJ elements MTJ(D1) and MTJ(D2) may be.

Therefore, it is then checked whether or not the settings of the reference cells have been terminated. In the case where the check result is affirmative, normal end of the task is established. In the case where the check result is negative, the setting of the data value is provided again by increasing a row address by 1 (ST10 to ST11).

As has been described above, the setting of the data value in response to a reference cell can be provided reliably, for a period of time, and automatically according to a sequence for setting the data value in response to a reference cell relating to the embodiment of the present invention. Therefore, a burden on a diode test process by this setting can be reduced, and reduction of a manufacturing cost can be reduced.

[5] General Read Operation

A general read operation is described as follows.

In the case where the read circuit of FIG. 9 is used, the switches SW1, SW2, and SW5 are turned on, and the switches SW3 and SW4 are turned off, thereby applying a read current (bias current) to the MTJ elements MT (D1) and MTJ(D2) of reference cells.

Here, the switch SW5 is turned on, and the MTJ elements MTJ(D1) and MTJ(D2) of two reference cells are shorted out. Thus, a just intermediate electric potential between the read electric potential obtained by the MTJ element which is set to "0" and the read electric potential obtained by the MTJ element which is set to "1" can be applied to the positive input terminal of the sense amplifier S/A in the read circuit 16.

In addition, in the read circuit 16, the switches SW2 and SW6 are turned on, and thus, the read current (bias current) is supplied to the MTJ element MTJ(M1). The read electric potential obtained by the MTJ element MTJ(M1) is input to the negative input terminal of the sense amplifier in the read circuit 16.

In the case where the read circuit of FIG. 10 is used, the switches SW6, SW2, SW41, and SW5 are turned on, and the switches SW3 and SW42 are turned off, thereby applying the read current (bias current) to the MTJ elements MTJ(D1) and MTJ(D2) of reference cells.

Here, the switch SW5 is turned on, and the MTJ elements MTJ(D1) and MTJ(D2) of two reference cells are shorted out. Thus, a just intermediate electric potential between the read electric potential obtained by the MTJ element which is set to "0" and the read electric potential obtained by the MTJ element which is set to "1" can be applied to the positive electric potential of the sense amplifier S/A(ref) in the read circuit 17.

In addition, during a general read operation, the switches SW2 and SW6 are turned on, and thus, the read current (bias current) is supplied to the MTJ element MTJ(M1). The read electric potential obtained by the MTJ element MTJ(M1) is input to the negative input terminal of the sense amplifier S/A(ref) in the read circuit 17.

[7] Summary

As has been described above, according to the second embodiment, there is proposed a sequence for automatically providing setting of a data value in response to a reference cell for generating a reference electric potential during a read operation. In this manner, a burden on a diode test process by this setting can be reduced, and reduction of a manufacturing cost can be achieved.

In addition, whether or not data in a reference cell reaches a target value is detected by adjustment of a bias current instead of a capacitor (first embodiment). Thus, the above sequence can be carried out by only a change of a current source, and an increase of a circuit area can be reduced.

In this sequence, a maximum effect can be attained by applying the present invention to a magnetic random access memory which uses a toggle write system having a special circumstance such that a state of a memory cell cannot be determined by carrying out write operation unless a read operation has been carried out in advance.

(3) Third Embodiment

The present embodiment relates to a sequence for setting a data value in response to a reference cell relating to an embodiment of the present invention. The present embodiment is featured in that detection of whether or not data in a reference cell reaches a target value is carried out by making characteristics of a sense amplifier in a reference cell read circuit different from those of a current sense amplifier.

[1] Overview

Figure 11:
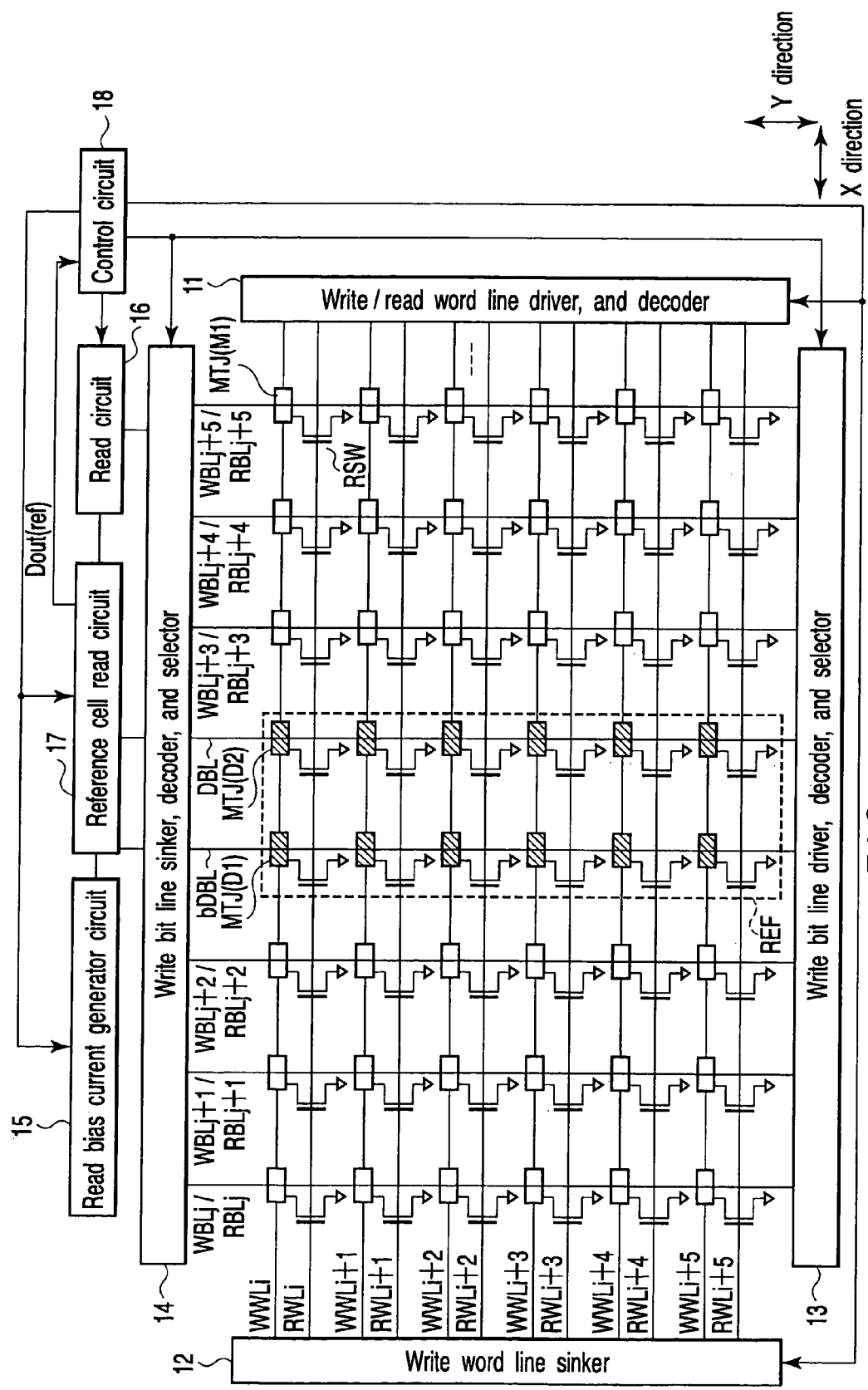
FIG. 11 is a block diagram depicting essential portions of an MRAM according to a third embodiment of the present invention.

FIG. 11 shows essential portions of a magnetic random access memory according to a third embodiment of the present invention.

The overview is identical to that of the magnetic random access memory shown in FIG. 1. A detailed description is omitted here.

In the present embodiment, the characteristics of the sense amplifier in the reference cell read circuit 17 are made different from those of a general sense amplifier. Thus, when a data value of a reference cell is set, it is possible to detect whether the MTJ element connected to the reference bit line bDBL has been set to "0" or the MTJ element connected to the reference bit line DBL has been set to "1".

[2] Read Circuit

FIG. 12 is a circuit diagram depicting an example of a read bias current generator circuit 15 and read circuits 16 and 17 in FIG. 11.

The reference cell read circuit 17 functions to setting an output signal Dout(ref) to "H" only when the MTJ element MTJ(D1) connected to the reference bit line bDBL is set to "0" and when the MTJ element MTJ(D2) connected to the reference bit line DBL is set to "1".

The reference bit line bDBL is connected to the positive input terminal of the sense amplifier S/A in the general read circuit 16 via the switch SW1.

A source of a P-channel MOS transistor P1 serving as a current source is connected to a power supply terminal Vdd, and a drain is connected to a reference bit line bDBL via the switch SW2. The transistor P1 configures a current mirror circuit together with a P-channel MOS transistor P5.

A source of the P-channel MOS transistor serving as a current source is connected to the power supply source Vdd, and a drain is connected to the reference bit line DBL via the switch SW2. The transistor P2 configures a current mirror circuit together with the P-channel MOS transistor P5.

Here, the sizes, i.e., conductance of the transistors P1, P2, and P5 are set to be equal to each other. Therefore, for example, when a constant current I is generated by the constant current source Isrce in the read bias current generator circuit 15, a bias current I is fed to the transistors P1 and P2 each, and the bias current is supplied to the MTJ elements MTJ(D1) and MTJ(D2).

The plus input terminal of the sense amplifier S/A(ref) is connected to the reference bit line bDBL via the switch SW4, and the negative input terminal of the sense amplifier S/A(ref) is connected to the reference bit line DBL via the switch SW4. The switch SW5 is connected between the reference bit lines DBL and bDBL.

on/off settings of the switches SW1 to SW5 are controlled by the control circuit 18 in FIG. 8 based on the sequence shown in FIG. 7 as in the first embodiment described above.

The read circuit 16 is used to read a data value of the MTJ element MTJ(M1) of a memory cell during a general read operation.

The positive input terminal of the sense amplifier S/A is connected to the reference bit lines DBL and bDBL via the switches SW1 and SW5. In addition, the negative input terminal of the sense amplifier S/A is connected to the write/read bit lines WBLj/RBLj via the switch SW6.

A source of a P-channel MOS transistor P3 serving as a current source is connected to the power supply terminal Vdd, and a drain is connected to the write/read bit lines WBLj/RBLj via the switches SW2 and SW6. The transistor P3 configures a current mirror circuit together with the P-channel MOS transistor P5.

The sizes, i.e., conductance of the transistors P3 and P5 are set to be equal to each other. Thus, when the constant current I is generated by the constant current source Isrce in the read bias current generator circuit 15, the bias current I is fed to the transistor P3, and the bias current is supplied to the MTJ element MTJ(M1).

In the present embodiment, unlike the first and second embodiments, it is necessary to change the characteristics of the sense amplifier during a general read operation and the characteristics of the sense amplifier for checking the state of a reference cell. Thus, both of them cannot be used in one combination.

Figure 13:
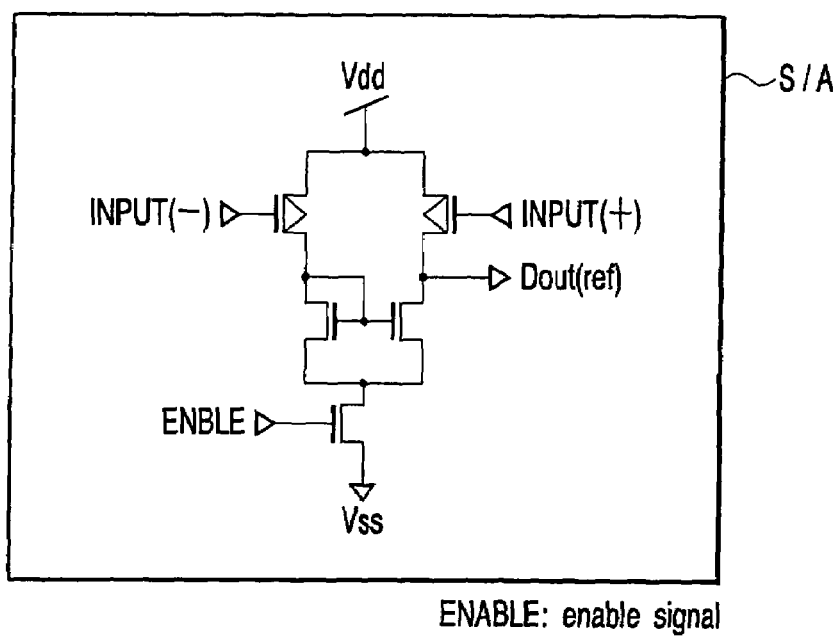
FIG. 13 is a circuit diagram depicting an example of a sense amplifier in the read circuit.
Figure 14:
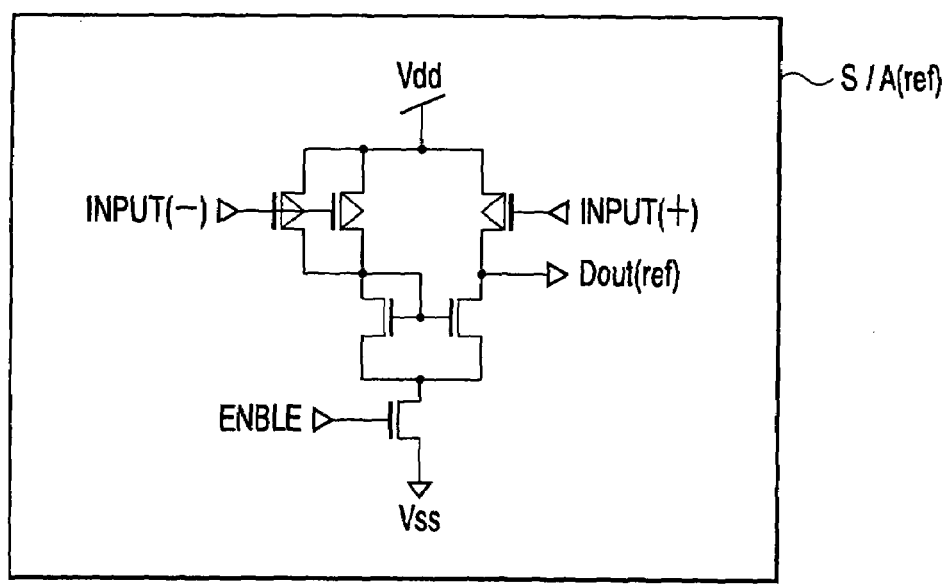
FIG. 14 is a circuit diagram depicting an example of a sense amplifier in a reference cell read circuit.

FIG. 13 is a circuit diagram depicting an example of a sense amplifier in the read circuit 16. FIG. 15 is a circuit diagram depicting an example of a sense amplifier in the read circuit 17.

A difference therebetween is that the sizes (conductance) of transistors connected to the negative input terminals are different from each other.

In the general read circuit 16, it is determined whether the read electric potential from the MTJ element MTJ(M1) targeted for a read operation is higher or lower than a reference electric potential. Thus, the size of the transistor connected to the negative input terminal is set to be equal to the size of the transistor connected to the positive input terminal.

In contrast, in the reference cell read circuit 17, the read electric potentials from two MTJ elements MTJ(D1) and MTJ(D2) which configure reference cells are equal to each other. In such a case also, that state must be detected by the sense amplifier S/A(ref). Thus, for example, the size of the transistor connected to the negative input terminal is set to be twice of the size of the transistor connected to the positive input terminal.

In this case, assuming that the electric potential INPUT(−) input to the negative input terminal of the sense amplifier S/A(ref) is equal to the electric potential INPUT(+) input to the positive input terminal (assuming that both of them are set to "L" or "HH"), that output electric potential Vout(ref) is set to "L".

Only when INPUT(−) is set to "H", and INPUT(+) is set to "L", i.e., only when the MTJ element MTJ(D1) connected to the reference bit line bDBL is set at a high resistance (set to "0"), and the MTJ element MTJ(M2) connected to the reference bit line DBL is set at a low resistance (set to "1"), the output electric potential element Vout(ref) is set to "H".

[3] Control Circuit and Write Circuit

A control circuit and a write circuit can be used as they are, as shown in FIG. 5 or 6.

[4] Setting Data Value in Response to Reference Cell

Now, a sequence for setting a data value in response to a reference cell will be described here.

In the present embodiment, a description will be given with respect to a sequence for setting to "0" a state of a reference cell connected to the reference bit line bDBL of FIG. 11 and setting to "1" a state of a reference cell connected to the reference bit line DBL.

As a reference cell read circuit, the circuit shown in FIG. 12 is used. As the other internal circuit, the circuit shown in FIG. 5 or 6 is used.

Here, with respect to the reference cell read circuit of FIG. 12, only when the MTJ element MTJ(D1) is set to "0", and the MTJ element MTJ(D2) is set to "1", the characteristics of the sense amplifier S/A(ref) are set in advance as follows so that the output signal Dout(ref) of the sense amplifier S/A(ref) is set to "H":

$$Rp \times I@\text{INPUT}(+) < Rp \times I@\text{INPUT}(-) < Ra \times I@\text{INPUT}(+) < Ra \times I@\text{INPUT}(-) \quad (2)$$

wherein Ra (=R+ΔR) is a reference value of an MTJ element which is set to "0"; Rp (=R) is a reference value of an MTJ element which is set to "1"; and I is a bias current applied to the MTJ elements MTJ(D1) and MTJ(D2) each.

In addition, ##×##@ INPUT(+) denotes that ##×## is input to the input terminal INPUT(+) of the sense amplifier. ##×##@ INPUT(−) denotes that ##×## is input to the input terminal INPUT(−) of the sense amplifier.

A sequence for setting a data value in response to a reference cell is completely identical to that of the first embodiment, as shown in FIG. 7.

There are N row addresses. A data value is set in response to a reference cell on a row by row basis. In addition, the settings of the data values is assumed to start from a row address row1 and end at a row address row N.

First, data in the MTJ elements MTJ(D1) and MTJ(D2) which belong to the first row address row1 are read (step ST1).

In this a read operation, the switch SW2 is turned on, and the switches SW1, SW4, SW5, and SW6 are turned off. By using the reference cell read circuit 17 of FIG. 12, a bias current I is supplied to the MTJ elements MTJ(D1) and MTJ(D2) each.

Then, the switch SW2 is turned off, and the bias current I is interrupted.

Then, the switch SW4 is turned on, and a comparison in electric potentials between a pair of reference bit lines DBL and bDBL is made by the sense amplifier S/A(ref).

The output result of the sense amplifier S/A(ref) presumed by this comparison in electric potentials is classified into the following four cases according to the initial states MTJ elements MTJ(D1) and MTJ(D2), as shown in Table 9.

TABLE 9

| D1 | D2 | | Dout(ref) |
|---|---|---|---|
| Ra | Rp | C > B | "H" |
| Rp(Ra) | Rp | A < B | "L" |
| Rp(Ra) | Ra | A < D | "L" |
| Ra(Rp) | Ra | C < D | "L" |
| A | B | C | D |
| Rp × I@INPUT(+) < Rp × I@INPUT(−) < Ra × I@INPUT(+) < Ra × I@INPUT(−) | | | |

CASE 1: When the resistance value of D1 is Ra and the resistance value of D2 is Rp, Dout(ref) is set to "H".
CASE 2: When the resistance value of D1 is Rp and the resistance value of D2 is Rp, Dout(ref) is set to "L".
CASE 3: When the resistance value of D1 is Rp and the resistance value of D2 is Ra, Dout(ref) is set to "L".
CASE 4: When the resistance value of D1 is Ra and the resistance value of D2 is Ra, Dout(ref) is set to "L".

As in the first embodiment, in CASE 1, Dout(ref) is set to "H". In CASE 2, CASE 3, and CASE 4, Dout(ref) is set to "L". When Dout(ref) is set to "L", only one write operation is carried out for the MTJ element MT (D1) (steps ST2, ST3, and ST10 to St11).

As a result, as shown in the parentheses of Table 9, the data values of the MTJ elements MTJ(D1) in CASE 1, CASE 3, and CASE 4 are inverted, respectively.

Then, data in the MTJ elements MTJ(D1) and MTJ(D2) of reference cells belonging to the row address row1 are read again (step ST4).

The output result of the sense amplifier S/A(ref) is classified into the following three cases according to the states of the MTJ elements MTJ(D1) and MTJ(D2), as shown in Table 10.

TABLE 10

| D1 | D2 | | Dout(ref) |
|---|---|---|---|
| Ra | Rp | C > B | "H" |
| Ra | Ra(Rp) | C < D | "L" |
| Rp | Ra(Rp) | A < D | "L" |
| A | B | C | D |
| Rp × I@INPUT(+) < Rp × I@INPUT(−) < Ra × I@INPUT(+) < Ra × I@INPUT(−) | | | |

CASE 1: When the resistance value of D1 is Ra and the resistance value of D2 is Rp, Dout(ref) is set to "H".
CASE 2: When the resistance value of D1 is Ra and the resistance value of D2 is Ra, Dout(ref) is set to "L".
CASE 3: When the resistance value of D1 is Rp and the resistance value of D2 is Ra, Dout(ref) is set to "L".

As in the first embodiment, in CASE 1, Dout(ref) is set to "H". In CASE 2 or CASE 3, Dout(ref) is set to "L". When Dout(ref) is set to "L", only one write operation is carried out for the MTJ element MTJ(D1) (steps ST5, St6, and ST10 to ST11).

As a result, as shown in the parentheses of Table 10, the data vales of the MTJ element MTJ(D2) in CASE 2 and CASE 3 are inverted, respectively.

Then, data in the MTJ elements MTJ(D1) and MTJ(D2) of reference cells belonging to the row address row1 are read again (step ST7).

The output result of the sense amplifier S/A(ref) is classified according to the states of the MTJ elements MTJ(D1) and MTJ(D2), as shown in Table 11.

TABLE 11

| D1 | D2 | | Dout(ref) |
|---|---|---|---|
| Ra | Rp | C > B | "H" |
| Rp(Ra) | Rp | A < B | "L" |
| A | B | C | D |
| Rp × I@INPUT(+) < Rp × I@INPUT(−) < Ra × I@INPUT(+) < Ra × I@INPUT(−) | | | |

CASE 1: When the resistance value of D1 is Ra and the resistance value of D2 is Rp, Dout(ref) is set to "H".
CASE 2: When the resistance value of D1 is Rp and the resistance value of D2 is Rp, Dout(ref) is set to "L".

As in the first embodiment, Dout(ref) is set to "H". In CASE 2, Dout(ref) is set to "L". When Dout(ref) is set to "L", only one write operation is carried out for the MTJ element MTJ(D1) (steps ST8 and ST9 to St11).

As a result, as shown in the parentheses of Table 11, the data value of the MTJ element MTJ(D1) in CASE 2 is inverted.

Here, with respect to CASE 2, as a result of inverting the data value of the MTJ element MTJ(D1), as shown in Table 12, the resistance value of the MTJ element MTJ(D1) is set at Ra, and the resistance value of the MTJ element MTJ(D2) is set at Rp. These reference values are set at their target data values.

TABLE 12

| D1 | D2 | | Dout(ref) |
|---|---|---|---|
| Ra | Rp | C > B | "H" |
| A | B | C | D |
| Rp × I@INPUT(+) < Rp × I@INPUT(−) < Ra × I@INPUT(+) < Ra × I@INPUT(−) | | | |

That is, when this stage has been reached, the data values of MTJ elements MTJ(D1) and MTJ(D2) reach their target values (resistance value of MTJ(D1): Ra and resistance value of MTJ(D2): Rp) whatever the initial states of the MTJ elements MTJ(D1) and MTJ(D2) may be.

Therefore, it is then checked whether or not all the settings of reference cells have been terminated. In the case where the check result is affirmative, normal end of the task is established. In the case where the check result is negative, setting of a data value is provided again by increasing a row address by 1 (steps ST10 to ST11).

As has been described above, according to the sequence for setting a data value in response to a reference cell relating to the embodiment of the present invention, a data value can be automatically set in response to a reference cell reliably, within a short period of time, and automatically. Therefore, a burden on a die sort test process by this setting can be reduced, and reduction of a manufacturing cost can be achieved.

[5] General Read Operation

A general read operation is described as follows.

A description will be given with respect to a case in which the read circuit of FIG. 12 is used.

First, the switches SW1, SW2, and SW5 are turned on, and the switches SW3 and SW4 are turned off, thereby applying a read current (bias current) to the MTJ elements MTJ(D1) and MTJ(D2) of reference cells.

Here, the switch SW5 is turned on, and the MTJ elements MTJ(D1) and MTJ(D2) of two reference cells are shorted out. Thus, a just intermediate electric potential between the read electric potential obtained by the MTJ element which is set to "0" and the read electric potential obtained by the MTJ element which is set to "1" can be applied to the positive input terminal of the sense amplifier S/A in the read circuit 16.

In addition, in the read circuit 16, the switches SW2 and SW6 are turned on, and thus, the read current (bias current) is supplied to the MTJ element MTJ(M1). The read electric potential obtained by the MTJ element MTJ(M1) is input to the negative input terminal of the sense amplifier in the read circuit 16.

[7] Summary

As has been described above, according to the third embodiment, there is proposed a sequence for automatically provide setting of a data value in response to a reference cell for generating a reference electric potential during a read operation. This setting can reduce a burden on a die sort process, and can achieve reduction of a manufacturing cost.

In addition, in the third embodiment, the characteristics of a sense amplifier in a reference cell read circuit are made different from the characteristics of a sense amplifier in a general read circuit. In this manner, it is detected whether or not data in a reference cell becomes a target value. Thus, a general read circuit other than the sense amplifier can be used, and a significant circuit change may not be made.

A maximum effect can be attained by applying the present invention to a magnetic random access memory which uses a toggle write system having a special circumstance such that a state of a memory cell cannot be determined by carrying out a write operation unless a read operation has been carried out in advance.

3. OTHERS

It is the most effective to apply the embodiments of the present invention to a magnetic random access memory using a toggle write system. Of course, the present embodiments can be applied to any other system. In addition, with respect to a cell array structure as well, the present embodiments can be applied to any other cell array structure without being limited to 1-transistor 1MTJ type as shown in the embodiments. Further, the embodiments of the present invention can be applied to a whole semiconductor memory for determining a data value of a memory cell by using a reference electric potential other than the magnetic random access memory.

By using a sequence relating to the embodiments of the present invention, an MTJ element can be always set at its predetermined state whatever the initial state of the MTJ element which configures a reference cell may be. In this case, although there is a need for a reference cell read circuit for detecting a state of an MTJ element which configures a reference cell, a general sense amplifier of a read circuit can be used with respect to the sense amplifier of this read circuit.

Moreover, with respect to a reference cell read circuit, an increase of a circuit area can be prevented by carrying out detection of a state of an MTJ element which configures a reference cell via adjustment of a bias current. In addition, detection of the state of the MTJ element which configures a reference cell is carried out by changing characteristics of the sense amplifier, whereby a general read circuit can be used as it is, with respect to the reference cell read circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
    a memory cell;
    a pair of reference cells for use in generation of a reference electric potential;
    a first read circuit which compares a read electric potential obtained from the memory cell with the reference electric potential and determines data in the memory cell;
    a second read circuit which detects a state of the pair of reference cells and outputs a detection signal indicating the state of the pair of reference cells; and
    a control circuit which controls a write operation for the pair of reference cells based on the detection signal.

2. The semiconductor memory according to claim 1, wherein the detection signal is a signal which indicates whether or not data in the pair of reference cells has become complementary data.

3. The semiconductor memory according to claim 1, wherein the second read circuit includes a sense amplifier having a first input terminal and a second input terminal, and when the state of the pair of reference cells is detected, a first capacitor is connected to the first input terminal, and a second capacitor which is larger than the first capacitor is connected to the second input terminal.

4. The semiconductor memory according to claim 1, wherein the second read circuit includes: a first current source which generates a first bias current and a second current source which generates a second bias current which is greater than the first bias current, and when the state of the pair of reference cells is detected, the first bias current is applied to one of the pair of reference cells, and the second bias current is applied to the other.

5. The semiconductor memory according to claim 1, wherein the first read circuit includes a first sense amplifier, the second read circuit includes a second sense amplifier, and characteristics of the first and second sense amplifiers are different from each other.

6. The semiconductor memory according to claim 5, wherein the second sense amplifier has a first input terminal and a second input terminal, and a conductance of a transistor which receives a signal to be input to the first input terminal is greater than a conductance of a transistor which receives a signal to be input to the second input terminal.

7. The semiconductor memory according to claim 1, wherein the second read circuit includes: a sense amplifier having a first input terminal and a second input terminal; a switch element connected between the first input terminal and one of the pair of reference cells; a switch element connected between the second input terminal and the other of the pair of reference cells; and a switch element connected between one of the pair of reference cells and the other.

8. The semiconductor memory according to claim 1, wherein each of the memory cell and the pair of reference cells is composed of a magnetoresistive element.

9. The semiconductor memory according to claim 8, wherein the magnetoresistive element has a structure which corresponds to a toggle write system.

10. The semiconductor memory according to claim 9, wherein the control circuit controls a write operation relevant to the pair of reference cells based on a predetermined setting sequence until the state of the pair of reference cells has been set at a target value.

11. The semiconductor memory according to claim 10, wherein the predetermined setting sequence is composed of: first, second and third read steps of detecting a state of the pair of reference cells; first, second, and third check steps of checking whether or not the state of the pair of reference cells is set at a target value; a first write step of carrying out a write operation for one of the pair of reference cells; a second write step of carrying out a write operation for the other; and a third write step of carrying out a write operation for the one, and the first read step, the first check step, the first write step, the second read step, the second check step, the second write step, the third read step, the third check step, and the third write step are executed in order, and when the state of the pair of reference cells reaches the target value, the subsequent steps are not carried out.

12. A semiconductor memory comprising:
a memory cell;
a pair of reference cells for use in generation of a reference electric potential;
a read circuit which, during a read operation, compares a read electric potential obtained from the memory cell with the reference electric potential to determine data in the memory cell, and during a test, detects a state of the pair of reference cells to output a detection signal which indicates the state of the pair of reference cells; and a control circuit which controls a write operation for the pair of reference cells based on the detection signal.

13. The semiconductor memory according to claim 12, wherein the detection signal is a signal which indicates whether or not data in the pair of reference cells has become complementary data.

14. The semiconductor memory according to claim 12, wherein the read circuit includes a sense amplifier having a first input terminal and a second input terminal, and during the test, a first capacitor is connected to the first input terminal, and a second capacity which is greater than the first capacitor is connected to the second input terminal.

15. The semiconductor memory according to claim 12, wherein the read circuit includes: a first current source which generates a first bias current; and a second current source which generates a second bias current which is greater than the first bias current, and during the test, the first bias current is applied to one of the pair of reference cells, and the second bias current is applied to the other.

16. The semiconductor memory according to claim 12, wherein the read circuit includes: a sense amplifier having a first input terminal and a second input terminal; a switch element connected to the first input terminal and one of the pair of reference cells; a switch element connected to the second input terminal and the other of the pair of reference cells; and a switch element connected to one of the pair of reference cells and the other.

17. The semiconductor memory according to claim 12, wherein each of the memory cell and the pair of reference cells is composed of a magnetoresistive element.

18. The semiconductor memory according to claim 17, wherein the magnetoresistive element has a structure which corresponds to a toggle write system.

19. The semiconductor memory according to claim 18, wherein the control circuit controls a write operation for the pair of reference cells based on a predetermined setting sequence until the state of the pair of reference cells has been set at a target value.

20. The semiconductor memory according to claim 19, wherein the predetermined setting sequence is composed of: first, second and third read steps of detecting a state of the pair of reference cells; first, second and third check steps of checking whether or not the state of the pair of reference cells is set at a target value; a first write step of carrying out a write operation for one of the pair of reference cells; a second write step of carrying out a write operation for the other; and a third write step of carrying out a write operation for the other, and the first read step, the first check step, the first write step, the second read step, the second check step, the second write step, the third read step, the third check step, and the third write step are executed in order, and when the state of the pair of reference cells reaches the target value, the subsequent steps are not carried out.

* * * * *